(12) United States Patent
Kotani et al.

(10) Patent No.: US 7,456,448 B2
(45) Date of Patent: Nov. 25, 2008

(54) SEMICONDUCTOR DEVICE AND METHOD FOR PRODUCING THE SAME

(75) Inventors: Naoki Kotani, Hyogo (JP); Akio Sebe, Osaka (JP); Gen Okazaki, Hyogo (JP); Tokuhiko Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 11/544,614

(22) Filed: Oct. 10, 2006

(65) Prior Publication Data

US 2007/0132018 A1 Jun. 14, 2007

(30) Foreign Application Priority Data

Dec. 14, 2005 (JP) .............................. 2005-360488

(51) Int. Cl.
*H01L 29/06* (2006.01)
*H01L 29/08* (2006.01)

(52) U.S. Cl. ...................... 257/224; 257/336; 257/369; 257/408

(58) Field of Classification Search ................. 257/224, 257/336, 369, 408, E29.024, E29.04
See application file for complete search history.

(56) References Cited

U.S. PATENT DOCUMENTS

| 7,053,450 | B2 * | 5/2006 | Kotani | 257/344 |
| 7,078,285 | B1 * | 7/2006 | Suenaga | 438/199 |
| 7,176,530 | B1 * | 2/2007 | Bulucea et al. | 257/369 |
| 2004/0188767 | A1 * | 9/2004 | Weber et al. | 257/369 |

FOREIGN PATENT DOCUMENTS

| JP | 2001-156291 | 6/2001 |
| JP | 3523151 | 2/2004 |

* cited by examiner

*Primary Examiner*—Victor A Mandala
(74) *Attorney, Agent, or Firm*—McDermott Will & Emery LLP

(57) ABSTRACT

A semiconductor device, including a first MIS-type transistor formed in a first region of a semiconductor region, the first region being of a first conductivity type, the first MIS-type transistor including: a first gate insulating film formed on the first region; a first gate electrode formed on the first gate insulating film; a first extension diffusion layer of a second conductivity type formed in a region of the first region under and beside the first gate electrode; and a first fluorine diffusion layer formed in a first channel region of the first conductivity type sandwiched between portions of the first extension diffusion layer, wherein portions of the first fluorine diffusion layer extend from the first extension diffusion layer and overlap together in a region directly under the first gate electrode.

11 Claims, 32 Drawing Sheets

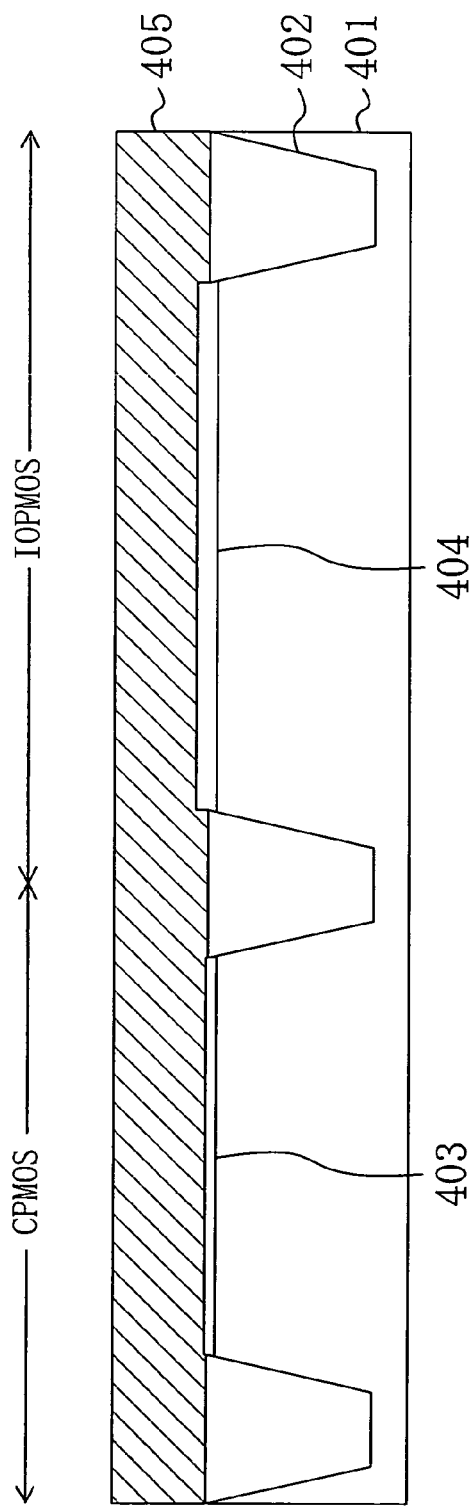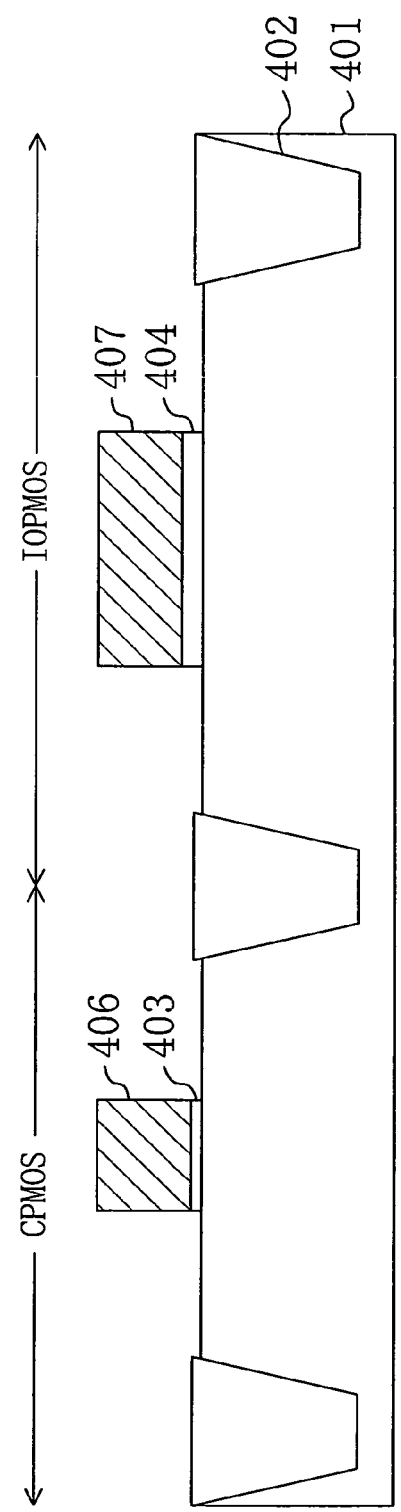
FIG. 7A
FIG. 7B

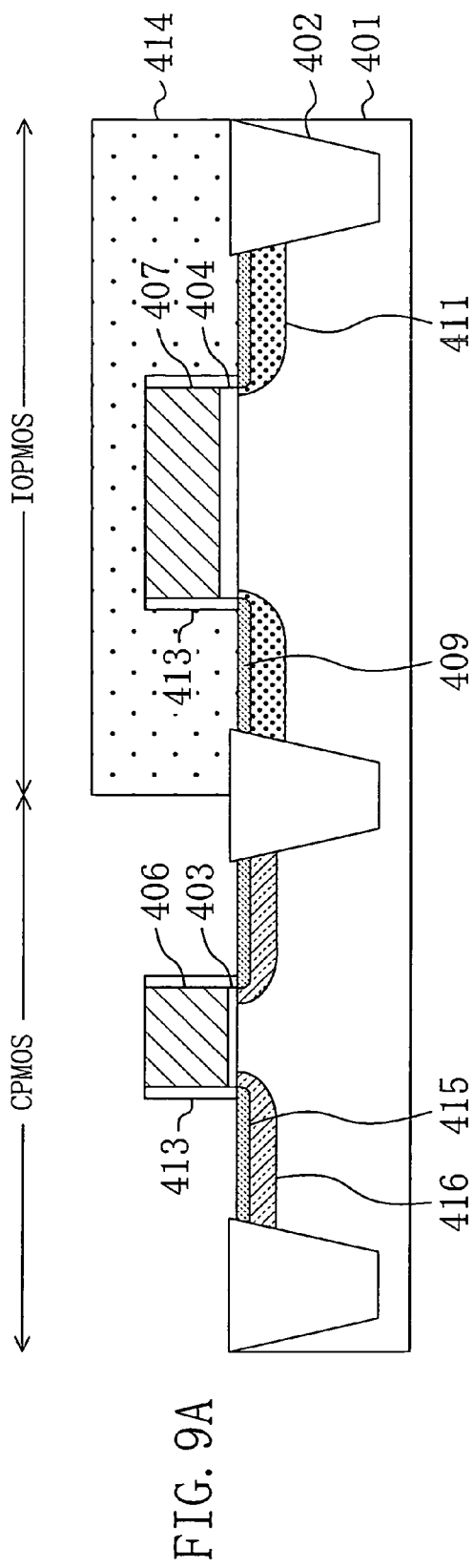
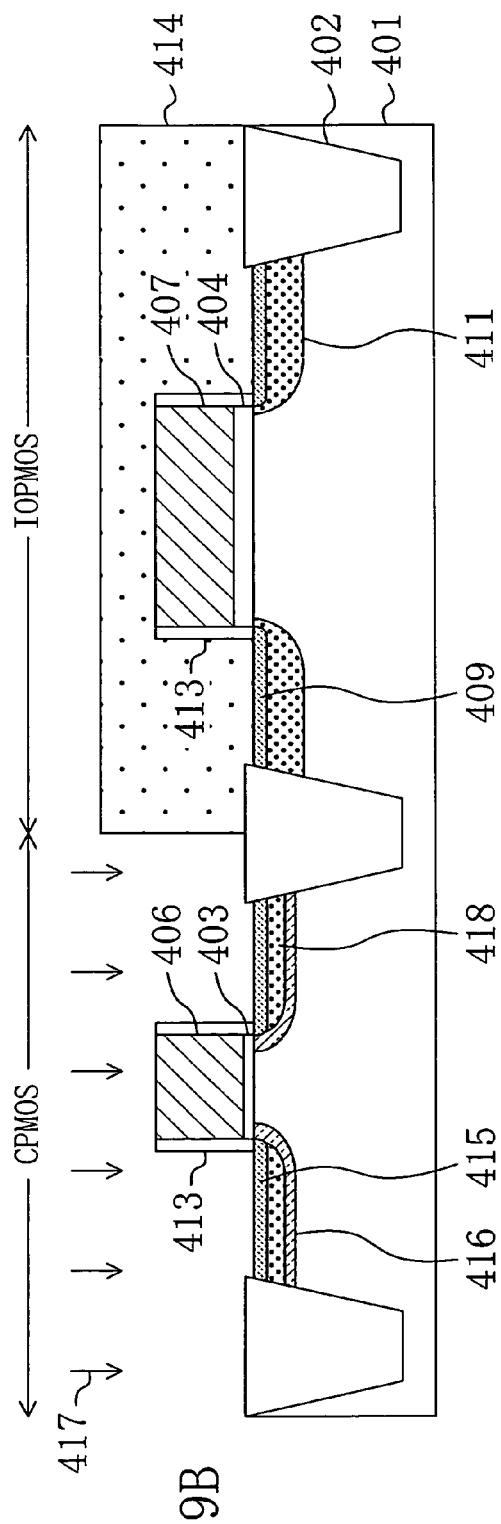
FIG. 9A
FIG. 9B

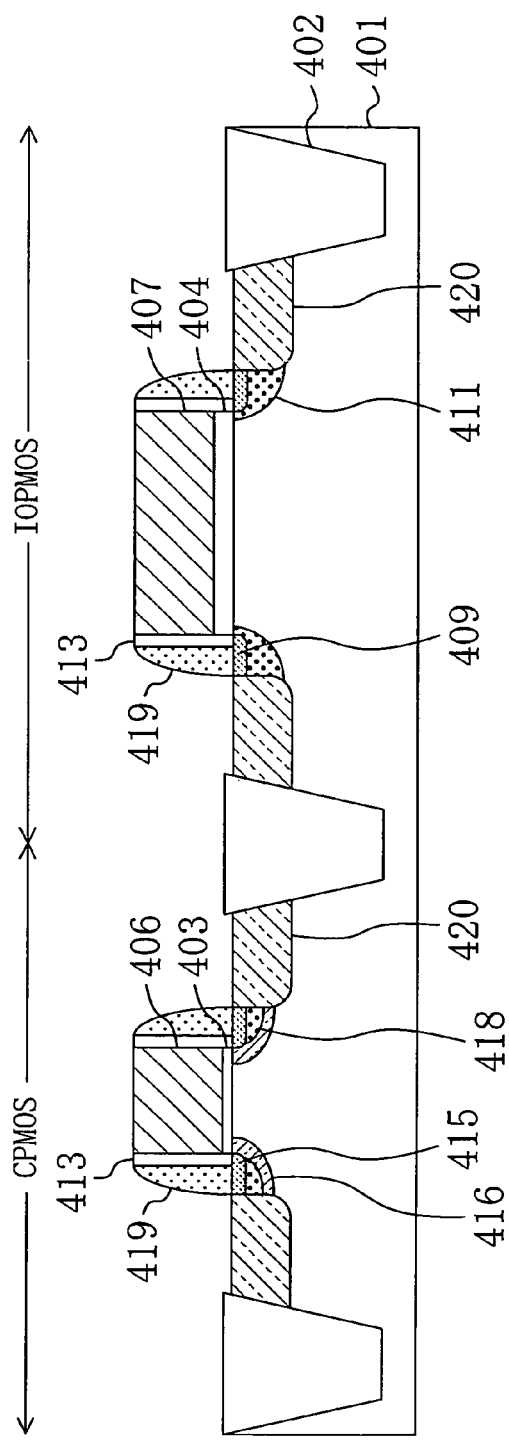
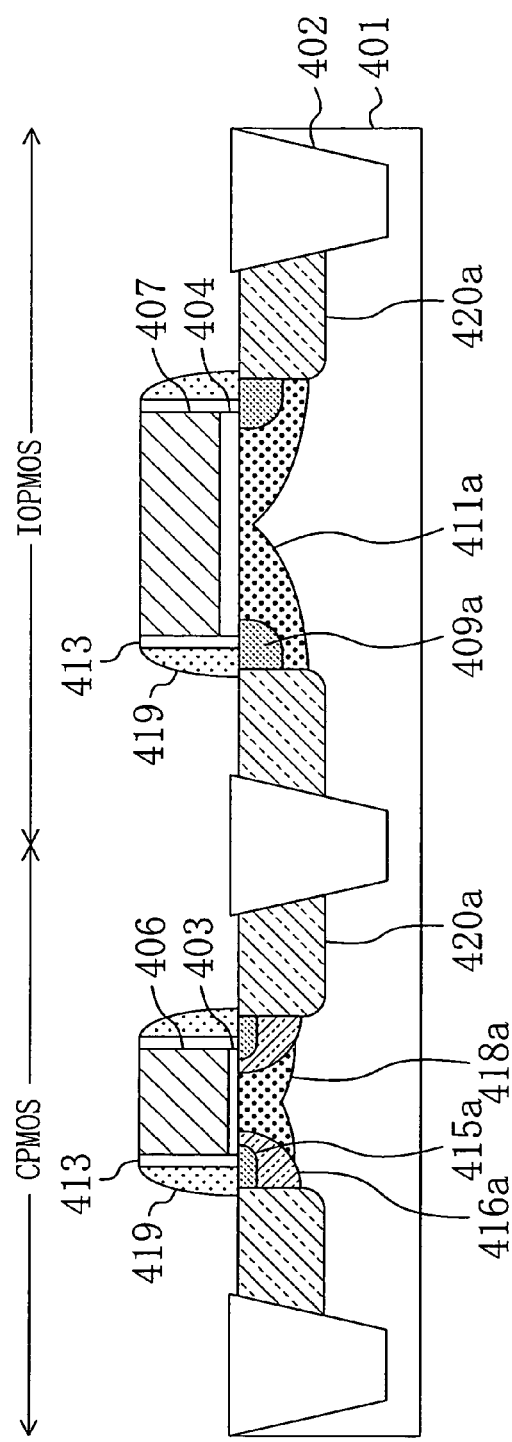
FIG. 10A
FIG. 10B

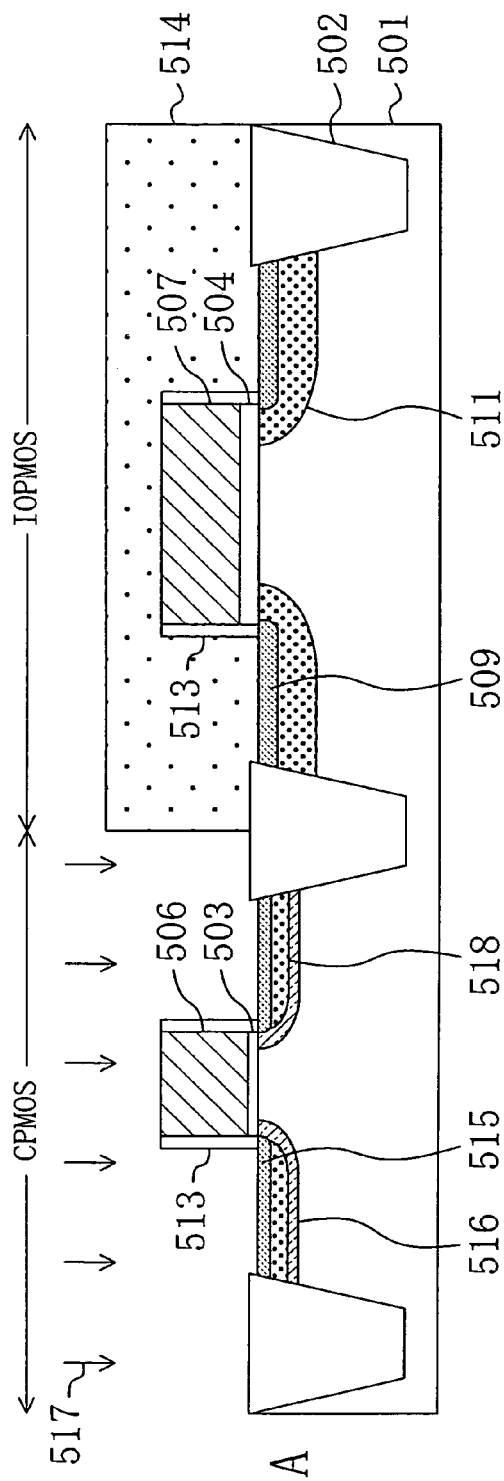
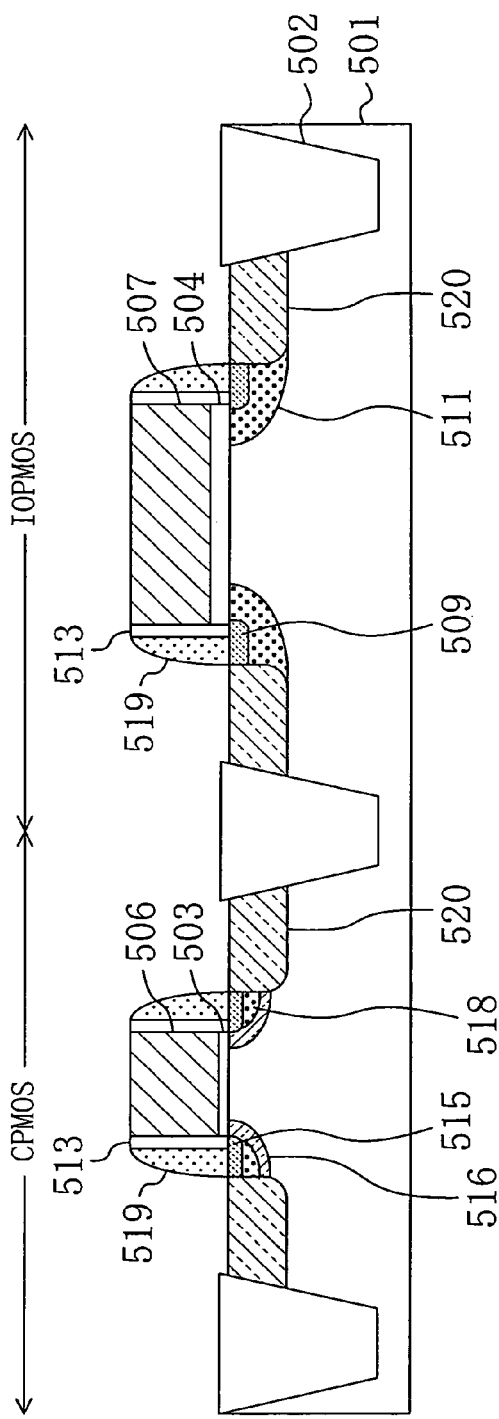
FIG. 15A
FIG. 15B

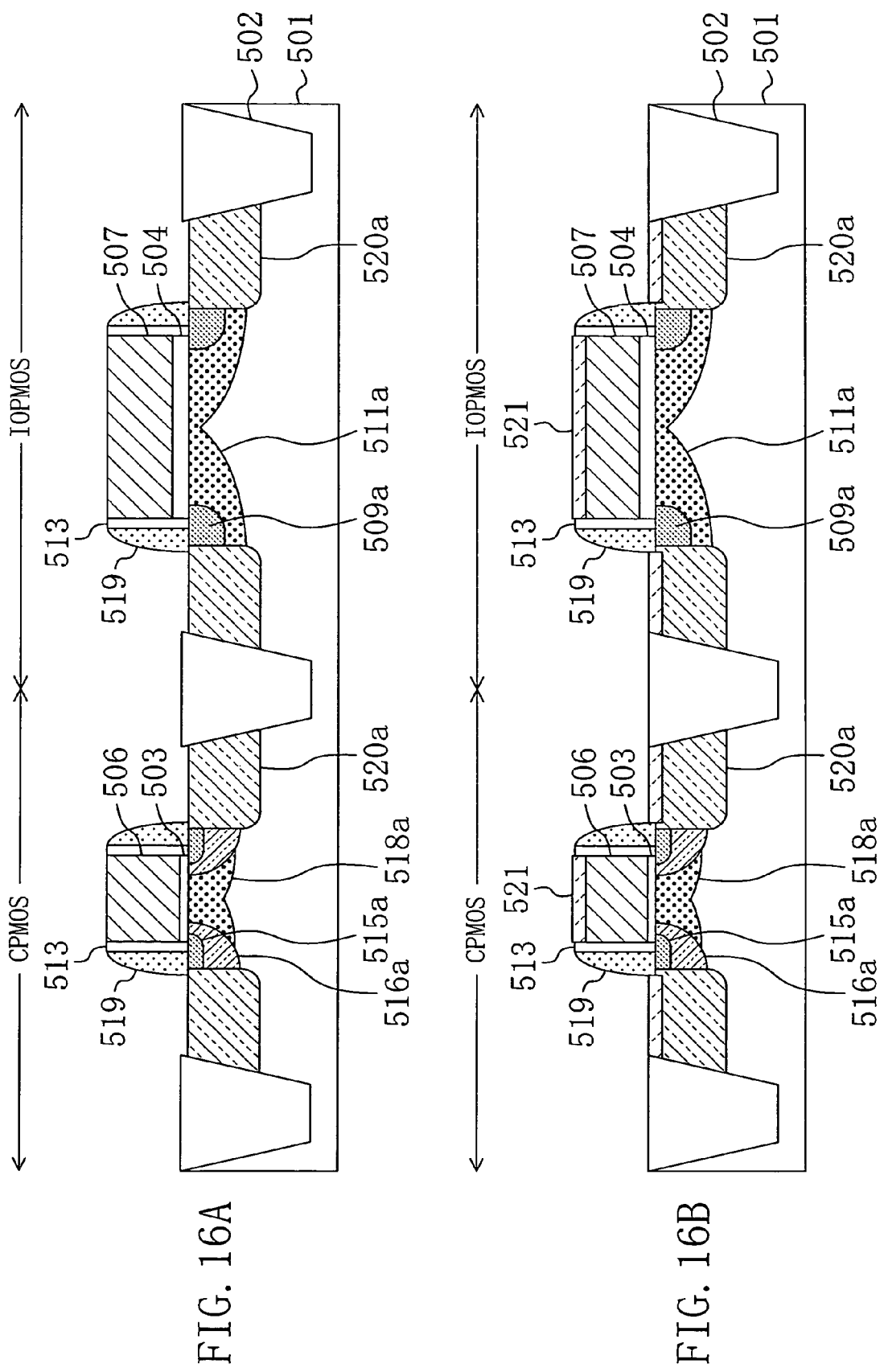

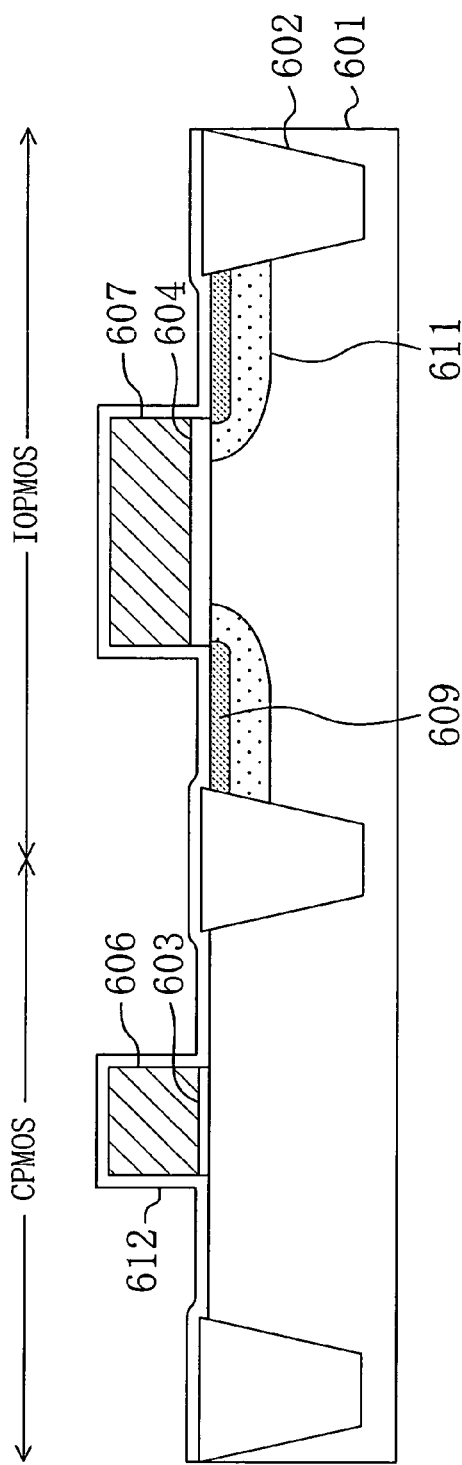
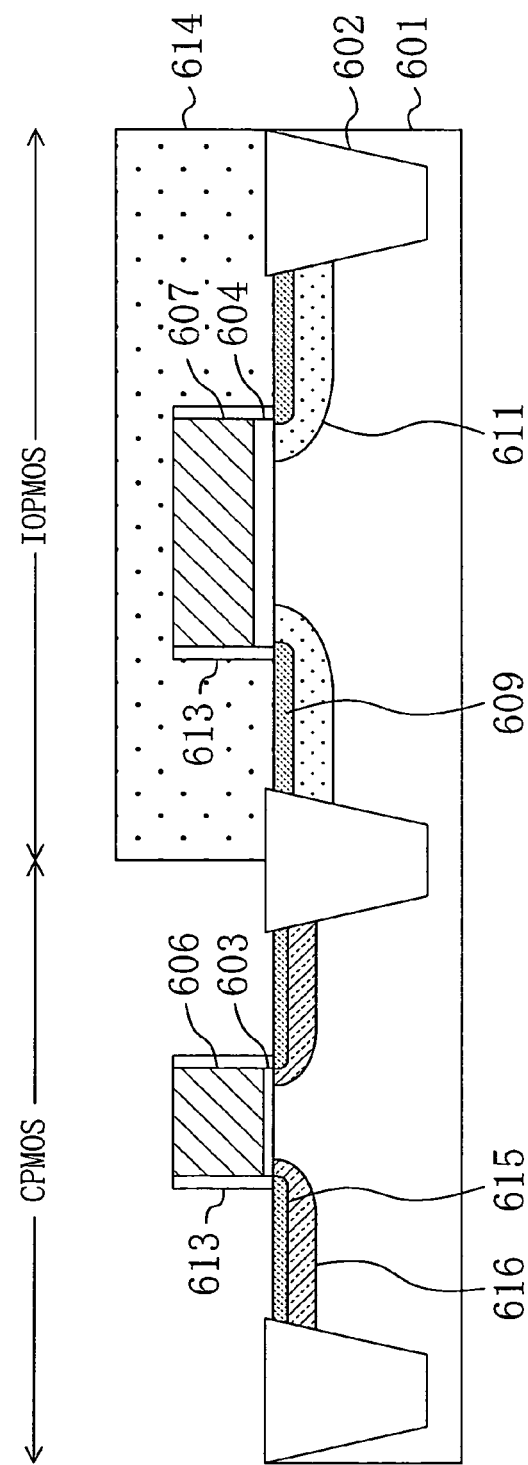
FIG. 19A
FIG. 19B

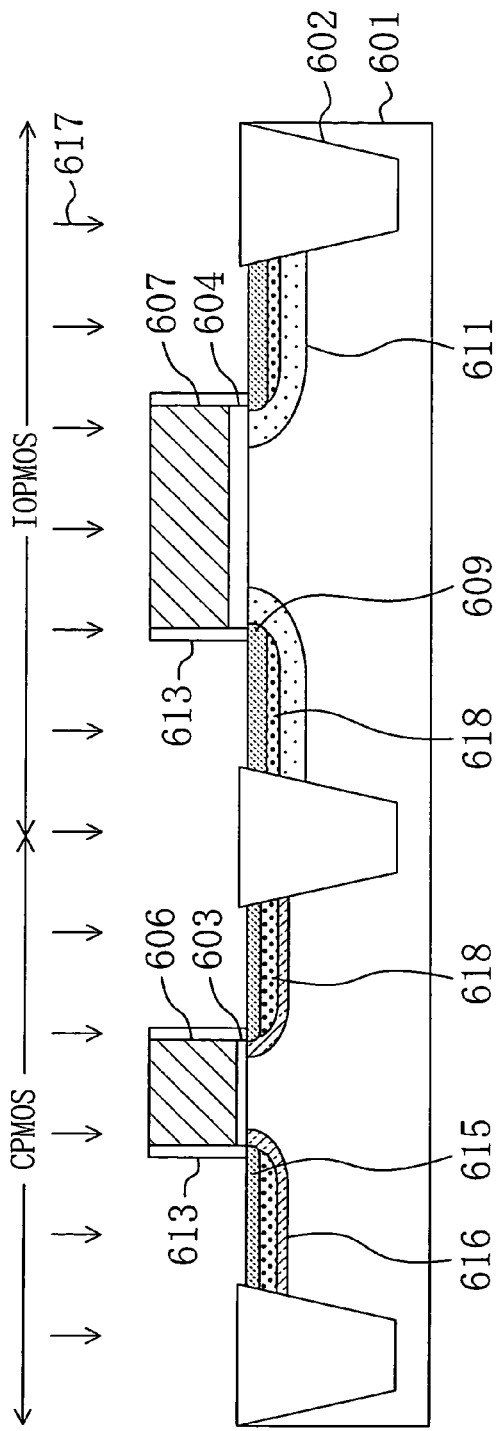
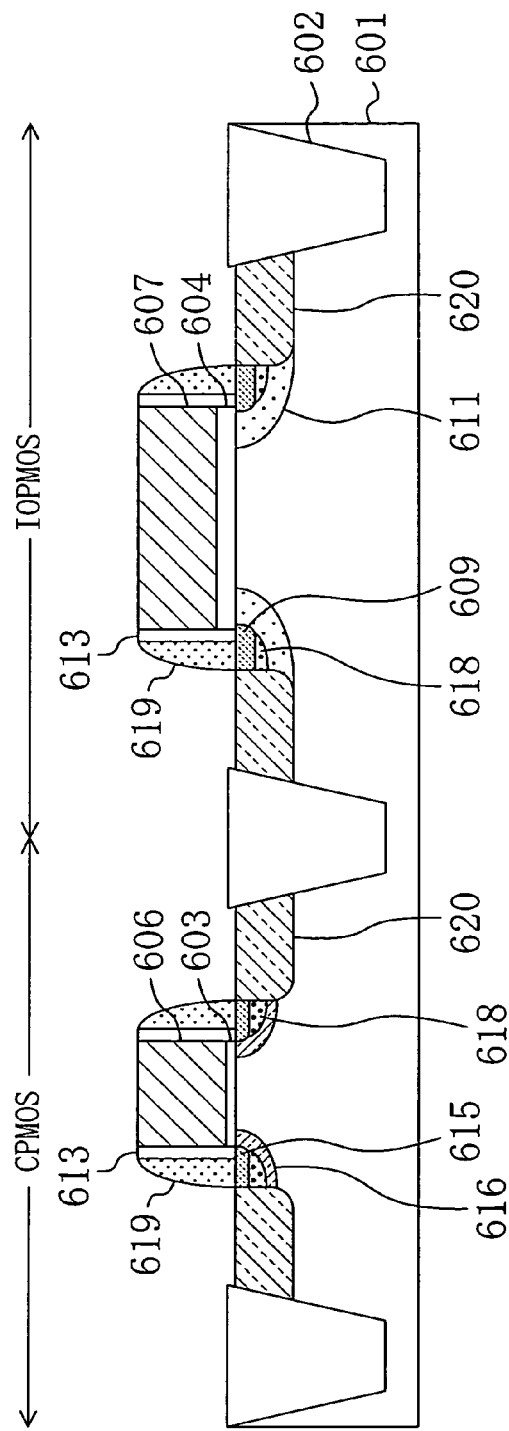
FIG. 20A
FIG. 20B

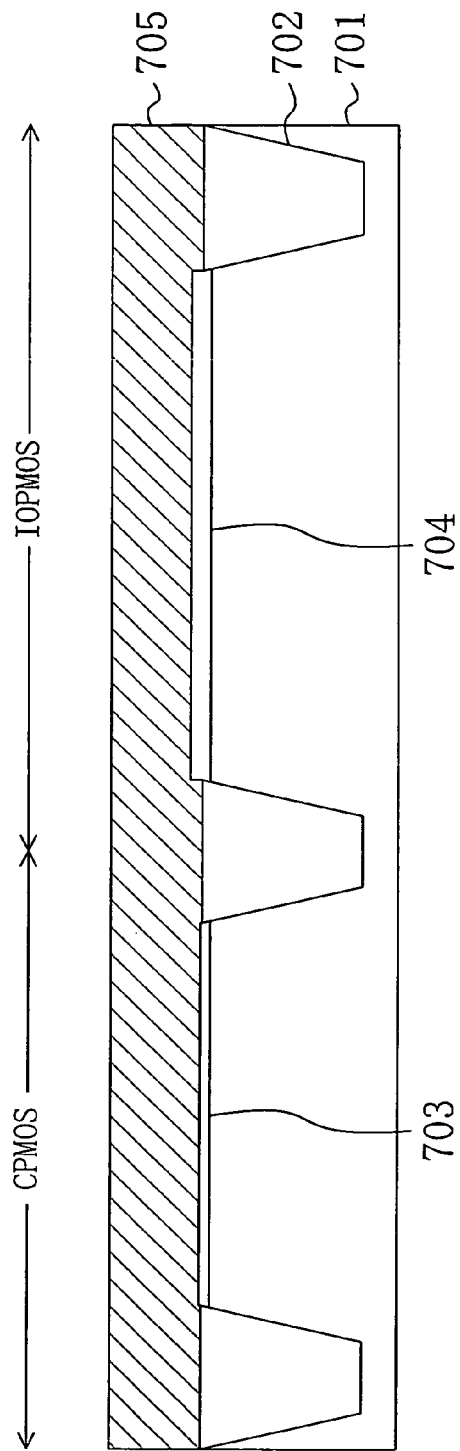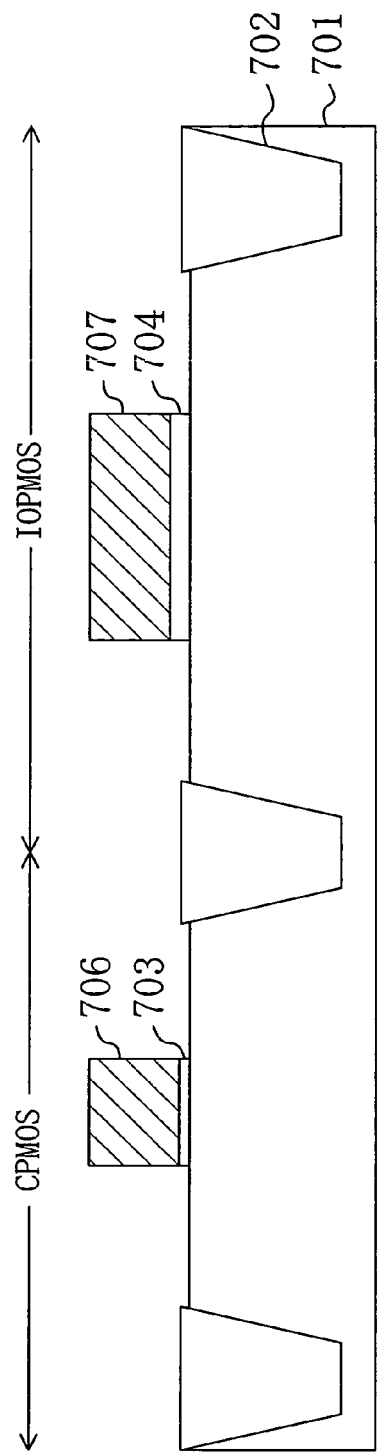
FIG. 22A
FIG. 22B

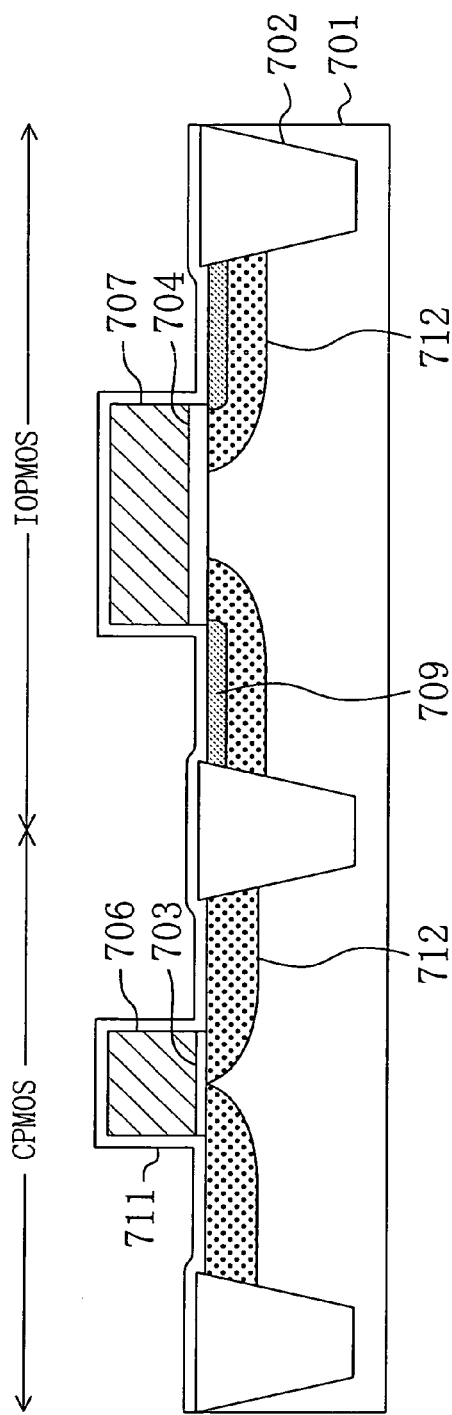
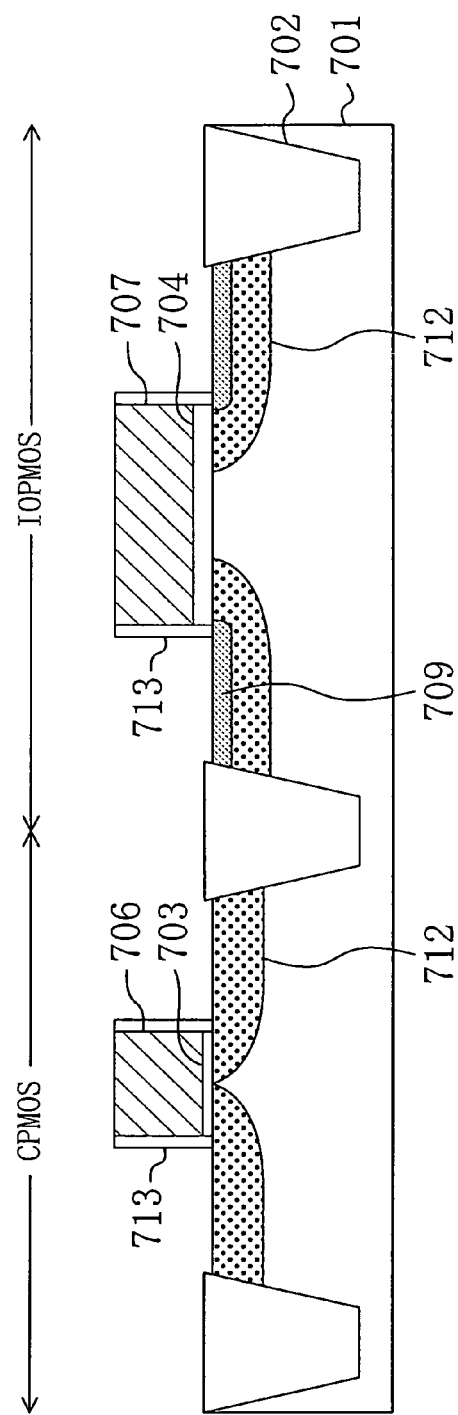
FIG. 24A
FIG. 24B

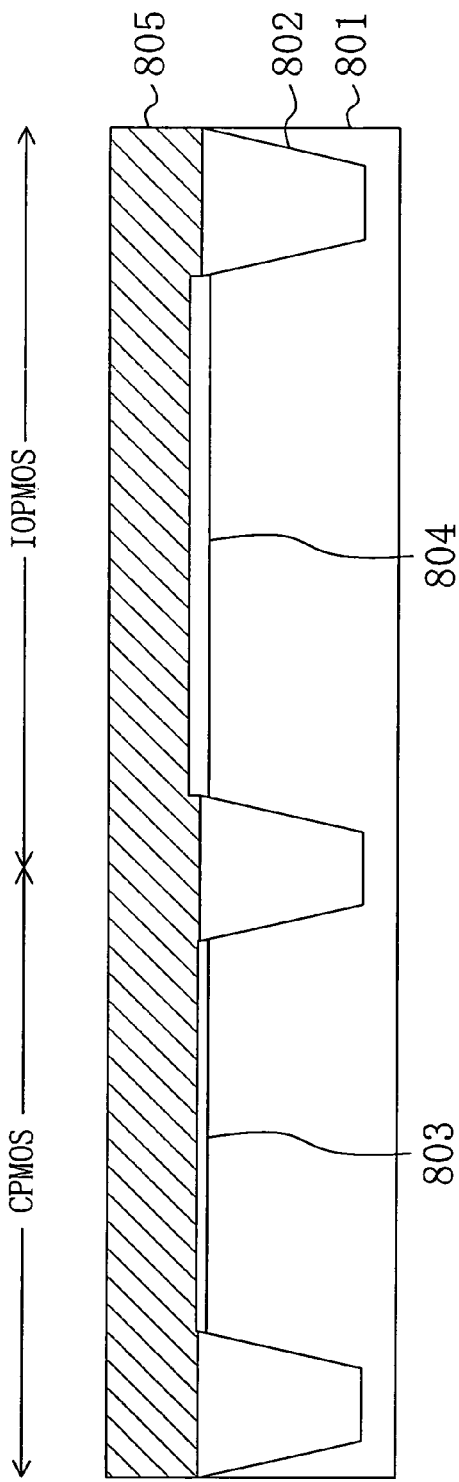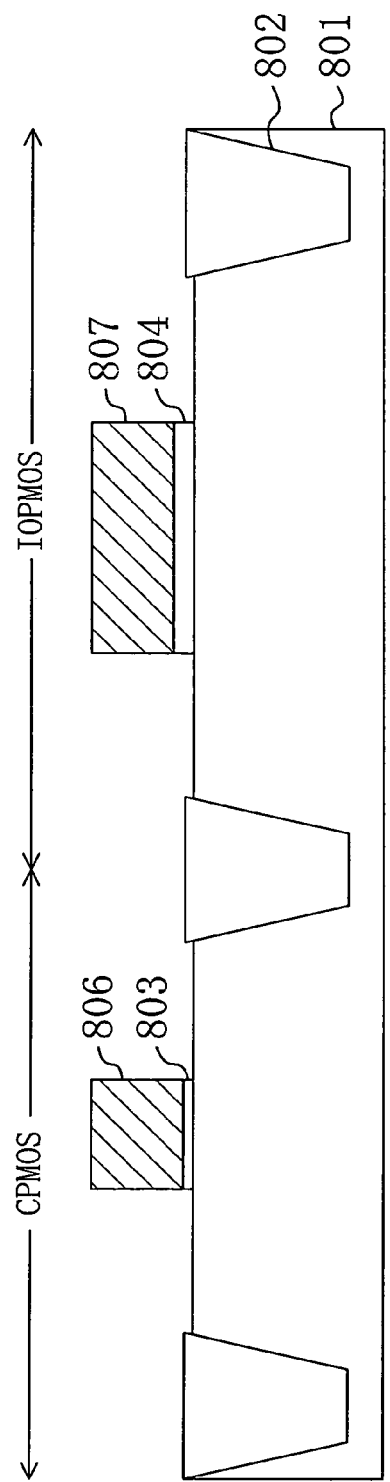
FIG. 27A
FIG. 27B

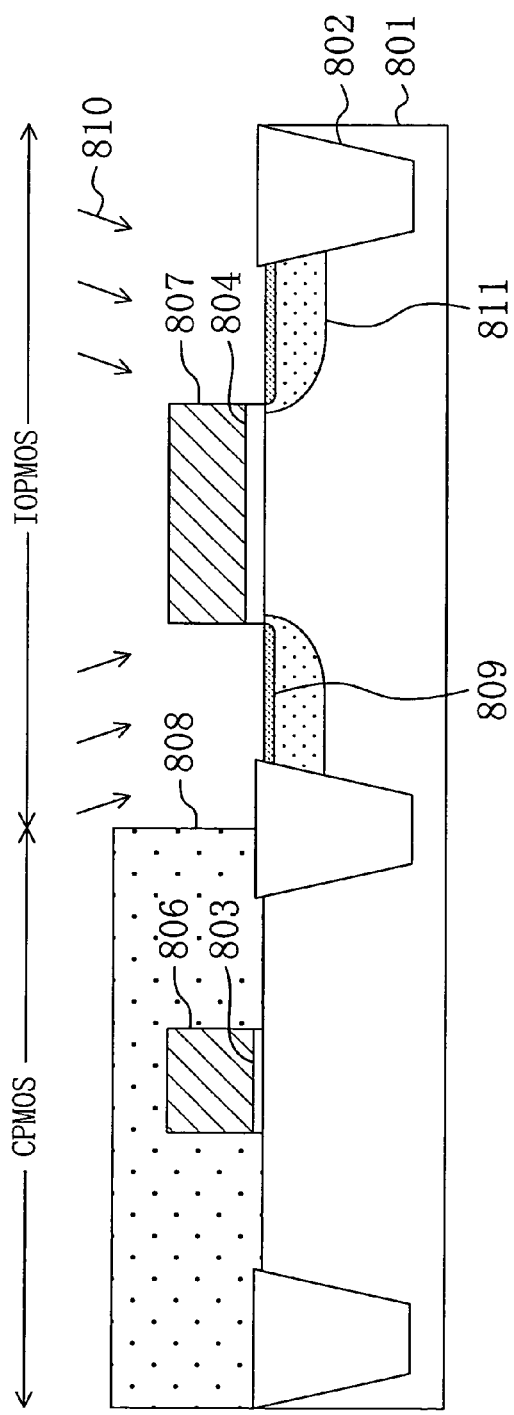
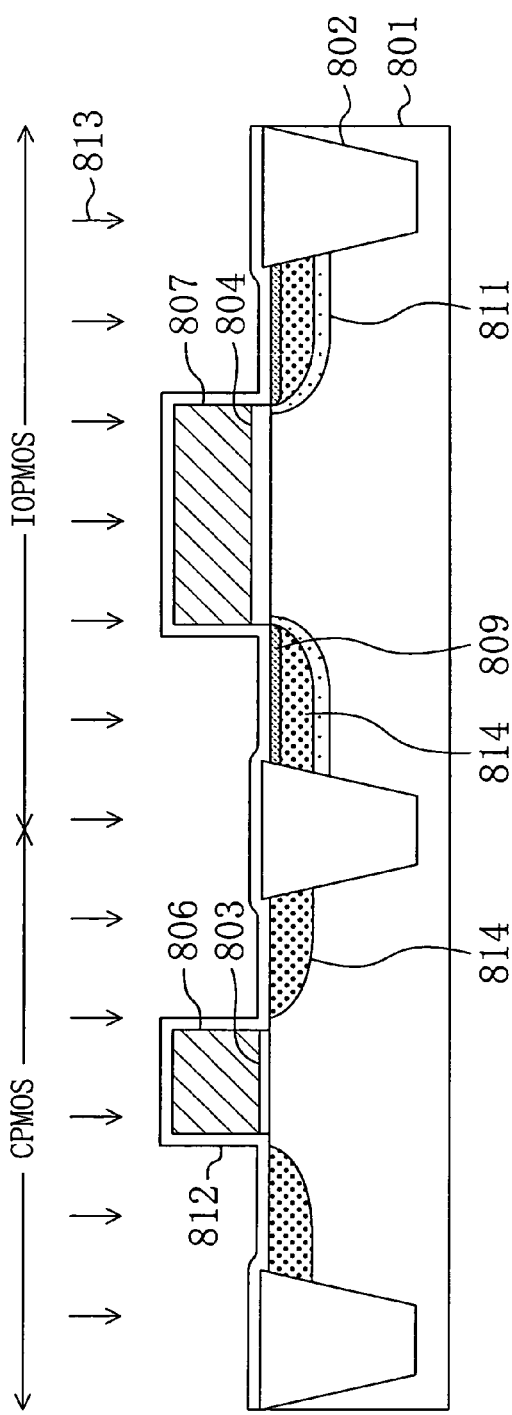
FIG. 28A
FIG. 28B

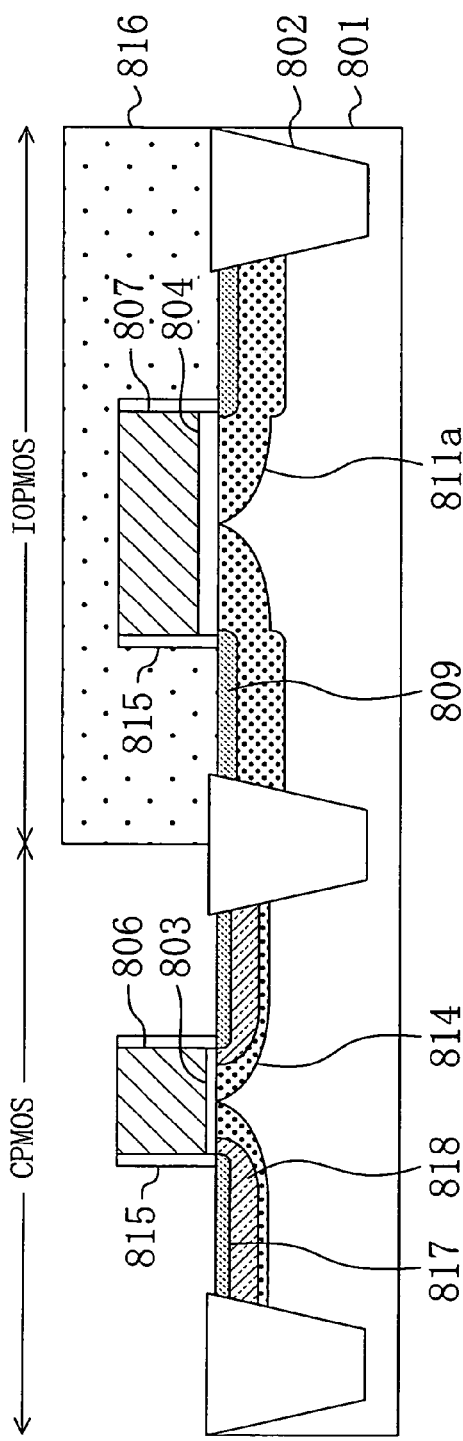
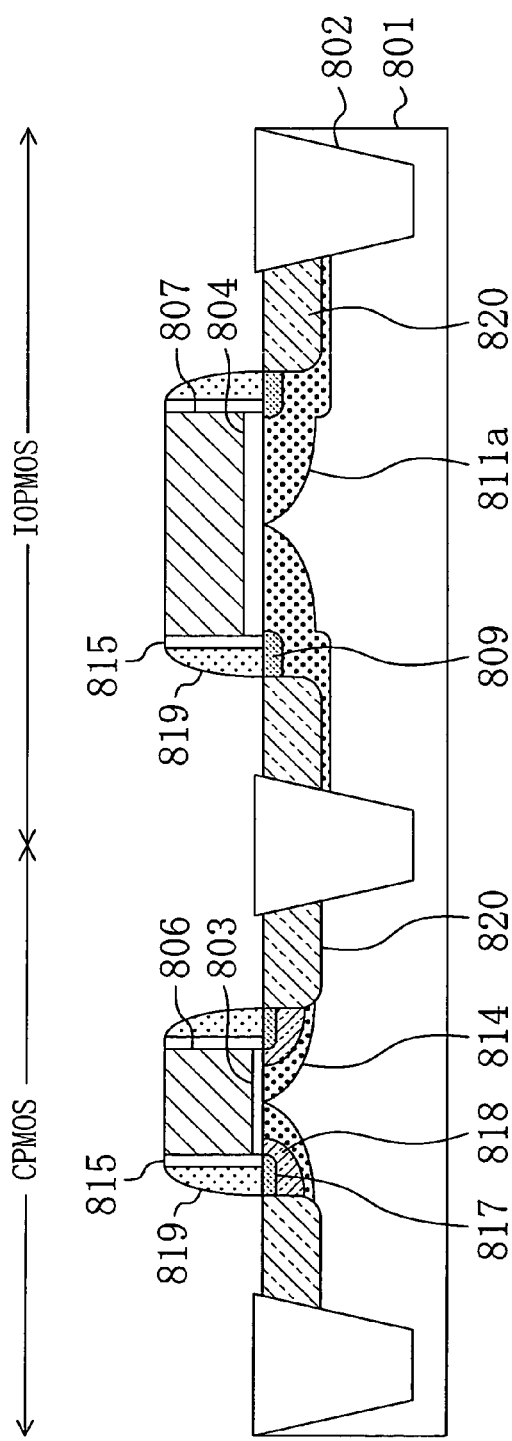
FIG. 30A
FIG. 30B

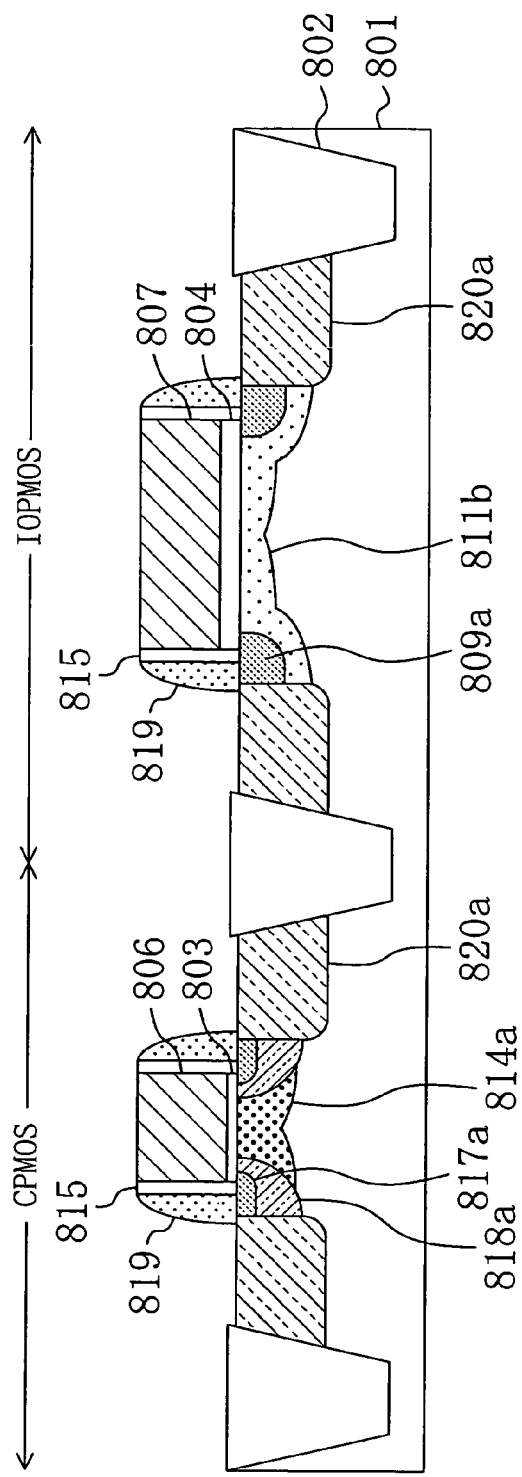
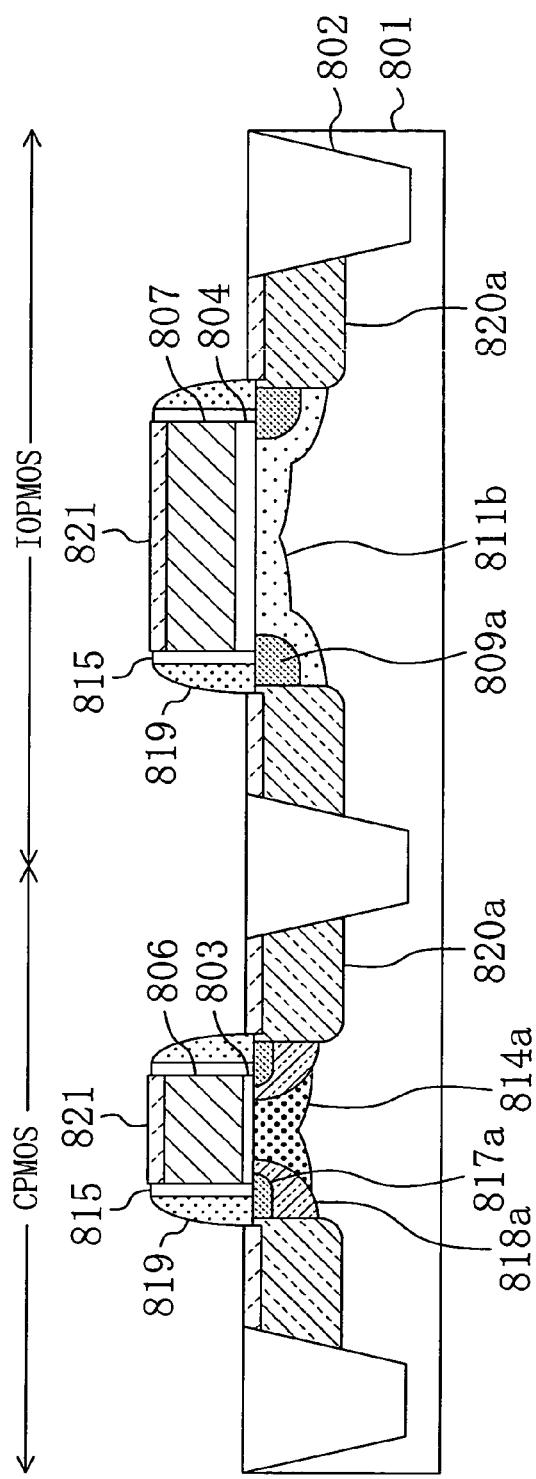
FIG. 31A
FIG. 31B

SEMICONDUCTOR DEVICE AND METHOD FOR PRODUCING THE SAME

BACKGROUND OF THE INVENTION

The present invention relates to a semiconductor device and a method for producing the same.

In recent years, along with the rapid miniaturization of semiconductor integrated circuit devices, the operating speed thereof has been increased and the power consumption thereof has been reduced. This results in an urgent need for improving transistors, and the gate oxide film has therefore been made thinner and thinner. As the thickness of the gate oxide film is reduced, reliability problems, such as NBTI (Negative Bias Temperature Instability) degradation, are being highlighted.

A conventional method for producing a semiconductor device will now be described.

FIGS. 32A to 32D are cross-sectional views sequentially showing the steps of the conventional method for producing a semiconductor device.

First, in the step shown in FIG. 32A, a gate electrode 4 is formed on a pMOS formation region 1a including an n-type well and on an nMOS formation region 1b including a p-type well, via a gate oxide film 3. The regions 1a and 1b are obtained by implanting an impurity into a semiconductor substrate 1. Then, a photoresist 5 is formed so as to cover the pMOS formation region 1a, and ions of an n-type impurity are implanted into the NMOS formation region 1b to form an extension diffusion layer 6. Then, in the presence of the photoresist 5, ions of a p-type impurity are implanted into the NMOS formation region 1b to form a pocket layer 7. Then, a heat treatment by an RTA method is performed, as necessary, for the purpose of removing interstitial silicon atoms.

Then, in the step shown in FIG. 32B, a photoresist 8 is formed, after removing the photoresist 5, so as to cover the NMOS formation region 1b, followed by a fluorine ion implantation 9 into the pMOS formation region 1a. Thus, a fluorine ion implantation region 9a is formed where fluorine ions are implanted into the surface of the pMOS formation region 1a.

Then, in the step shown in FIG. 32C, first and second heat treatments are performed. The first heat treatment is performed for the purpose of eliminating interstitial silicon atoms, which have occurred in the surface of the semiconductor substrate upon implantation of fluorine ions. The first heat treatment is performed for the purpose of sufficiently activating impurities while reducing the damage to the semiconductor substrate, and is performed at a high temperature for a short period of time by using a method such as RTA. The second heat treatment is performed for the purpose of achieving the diffusion of the fluorine ion implantation region 9a, and is performed at a lower temperature than the first heat treatment for a long period of time by using a furnace annealing process.

Then, in the step shown in FIG. 32D, a photoresist 10 is formed so as to cover the nMOS formation region 1b, and ions of a p-type impurity are implanted into the pMOS formation region 1a to form an extension diffusion layer 11. Then, in the presence of the photoresist 10, ions of an n-type impurity are implanted into the pMOS formation region 1a to form a pocket layer 12 (see, for example, JP 3523151).

SUMMARY OF THE INVENTION

With the conventional method for producing a semiconductor device, two heat treatments are performed in the step shown in FIG. 32C. When the semiconductor device is further miniaturized, this has a non-negligible influence on the channel region or the extension diffusion layer, and may introduce variations in the characteristics of the semiconductor device. JP 3523151 fails to give any disclosure as to the profile of the region where fluorine ions are diffused for improving the NBTI degradation.

In view of the above, a first object of the present invention is to provide a semiconductor device and a method for producing the same, with which it is possible to suppress the NBTI degradation without introducing characteristics variations. A second object of the present invention is to provide a semiconductor device including a plurality of types of transistors and a method for producing the same, with which it is possible to suppress the NBTI degradation without introducing characteristics variations.

In order to achieve the objects set forth above, a semiconductor device in one aspect of the present invention is a semiconductor device, including a first MIS-type transistor formed in a first region of a semiconductor region, the first region being of a first conductivity type, the first MIS-type transistor including: a first gate insulating film formed on the first region; a first gate electrode formed on the first gate insulating film; a first extension diffusion layer of a second conductivity type formed in a region of the first region under and beside the first gate electrode; and a first fluorine diffusion layer formed in a first channel region of the first conductivity type sandwiched between portions of the first extension diffusion layer, wherein portions of the first fluorine diffusion layer extend from the first extension diffusion layer and overlap together in a region directly under the first gate electrode.

In this aspect of the present invention, the semiconductor device may include the first fluorine diffusion layer having a profile obtained by portions thereof overlapping together in a region directly under the first gate electrode, whereby it is possible to suppress the NBTI degradation.

In one aspect of the present invention, the semiconductor device may further include: a first MIS-type transistor sidewall formed on a side surface of the first gate electrode; and a first source-drain diffusion layer of the second conductivity type formed in a region of the first region under and beside the first MIS-type transistor sidewall so as to be adjacent to the first extension diffusion layer.

With this structure, the first MIS-type transistor sidewall may further include: a plate-shaped first sidewall formed on a side surface of the first gate electrode; and a second sidewall formed on a side surface of the first sidewall.

In one aspect of the present invention, the semiconductor device may further include a silicide layer formed on the first gate electrode and the first source-drain diffusion layer.

In one aspect of the present invention, it is preferred that the semiconductor device further includes a second MIS-type transistor formed in a second region of the semiconductor region, different from the first region, the second region being of the first conductivity type, the second MIS-type transistor including: a second gate insulating film formed on the second region; a second gate electrode formed on the second gate insulating film and having a gate length longer than that of the first gate electrode; a second extension diffusion layer of a second conductivity type formed in a region of the second region under and beside the second gate electrode; and a second fluorine diffusion layer formed in a second channel region of the first conductivity type sandwiched between portions of the second extension diffusion layer, wherein portions of the second fluorine diffusion layer extend from the second extension diffusion layer and overlap together in a region directly under the second gate electrode.

Thus, in a semiconductor device including a plurality of types of transistors on a semiconductor region, it is possible to suppress the NBTI degradation without introducing characteristics variations.

In one aspect of the present invention, the second MIS transistor of the semiconductor device may further include: a second MIS-type transistor sidewall formed on a side surface of the second gate electrode; and a second source-drain diffusion layer of the second conductivity type formed in a region of the second region under and beside the second MIS-type transistor sidewall so as to be adjacent to the second extension diffusion layer.

With this structure, the second MIS-type transistor sidewall may further include: a plate-shaped third sidewall formed on a side surface of the first gate electrode; and a fourth sidewall formed on a side surface of the first sidewall.

In one aspect of the present invention, it is preferred that a pocket layer of the first conductivity type covering a lower side of the first extension diffusion layer is formed in the region of the first region under and beside the first gate electrode, whereas a pocket layer of the first conductivity type covering a lower side of the second extension diffusion layer is not formed in a region of the second region under and beside the second gate electrode. Thus, the first MIS-type transistor and second MIS-type transistor are different from each other with respect to the presence/absence of the pocket layer.

In one aspect of the present invention, a thickness of the second gate insulating film is greater than that of the first gate insulating film, and a voltage applied to the first gate electrode is lower than that applied to the second gate electrode, in which case the present invention is more effective for a peripheral circuit region, which has a high power supply voltage and in which NBTI degradation is more likely to occur, for example.

In one aspect of the present invention, the first conductivity type is n type and the second conductivity type is p type, in which case it is possible to effectively suppress the NBTI degradation.

A method for producing a semiconductor device in one aspect of the present invention includes: a step (a) of forming a first gate insulating film on a first region of a semiconductor region, the first region being of a first conductivity type; a step (b) of forming a first gate electrode on the first gate insulating film; a step (c) of performing an ion implantation of an impurity of a second conductivity type using the first gate electrode as a mask to form a first extension implantation layer in a region of the first region under and beside the first gate electrode; a step (d) of performing an ion implantation of fluorine ions using the first gate electrode as a mask to form a first fluorine implantation layer in the region of the first region under and beside the first gate electrode; and a step (e) of, after the steps (c) and (d), performing a heat treatment to form a first extension diffusion layer obtained by diffusing the first extension implantation layer, and to diffuse the first fluorine implantation layer to form a first fluorine diffusion layer portions of which overlap together directly under the first gate electrode.

In this aspect of the present invention, it is possible with a single heat treatment to form the first fluorine diffusion layer having a profile obtained by portions thereof overlapping together in a region directly under the first gate electrode. Thus, it is possible to suppress the NBTI degradation without introducing characteristics variations.

In one aspect of the present invention, the method for producing a semiconductor device may further include, after the steps (c) and (d) and before the step (e), a step (f) of forming a first MIS-type transistor sidewall on a side surface of the first gate electrode and then performing an ion implantation of an impurity of the second conductivity type using the first MIS-type transistor sidewall as a mask to form a first source-drain implantation layer in a region of the first region under and beside the first MIS-type transistor sidewall so as to be adjacent to the first extension implantation layer and the first fluorine implantation layer, wherein the step (e) includes a step of forming a first source-drain diffusion layer obtained by diffusing the first source-drain implantation layer.

In a method for producing a semiconductor device in one aspect of the present invention, being a first method for producing a semiconductor device including a plurality of types of transistors, it is preferred that the step (a) further includes a step of forming a second gate insulating film on a second region of the semiconductor region, the second region being of the first conductivity type and being different from the first region; the step (b) includes a step of forming a second gate electrode on the second gate insulating film, the second gate electrode having a gate length longer than that of the first gate electrode; the method further includes, after the step (b) and before the step (c), a step (g) of performing an ion implantation of an impurity of the second conductivity type using the second gate electrode as a mask to form a second extension implantation layer in a region of the second region under and beside the second gate electrode, and a step (h) of performing an ion implantation of fluorine ions using the second gate electrode as a mask to form a second fluorine implantation layer in a region of the second region under and beside the second gate electrode; and the step (e) includes a step of forming the second fluorine diffusion layer obtained by diffusing the second fluorine implantation layer.

Thus, when producing a semiconductor device including a plurality of types of transistors are provided on a semiconductor region, it is possible with a single heat treatment to form the second fluorine diffusion layer having a profile obtained by portions thereof overlapping together in a region directly under the second gate electrode. Thus, it is possible to suppress the NBTI degradation of a plurality of types of transistors without introducing characteristics variations.

In the first method for producing a semiconductor device, the fluorine ions are implanted in the step (h) in a direction inclined with respect to an axis perpendicular to a surface of the semiconductor region. Then, it is possible to realize the second fluorine implantation layer having a profile obtained by portions thereof overlapping together to a greater degree in a region directly under the second gate electrode.

In the first method for producing a semiconductor device, the step (f) may include a step of forming a second MIS-type transistor sidewall on a side surface of the second gate electrode and then performing an ion implantation of an impurity of the second conductivity type using the second MIS-type transistor sidewall as a mask to form a second source-drain implantation layer in a region of the second region under and beside the second MIS-type transistor sidewall so as to be adjacent to the second extension diffusion layer and the second fluorine implantation layer; and the step (e) may include a step of forming a second source-drain diffusion layer obtained by diffusing the second source-drain implantation layer.

It is preferred that the first method for producing a semiconductor device further includes, after the step (h) and before the step (c), a step of performing a heat treatment.

Thus, as the second fluorine implantation layer is previously diffused, it is possible, through the heat treatment of step (e), to realize the second fluorine diffusion layer having a profile obtained by portions of the second fluorine implantation layer being diffused into, and sufficiently overlapping in, a region directly under the second gate electrode.

In the first method for producing a semiconductor device, it is preferred that the step (d) includes a step of further using the second gate electrode as a mask to form the first fluorine implantation layer also in a region of the second region under the second extension implantation layer; and the step (e) includes a step of forming the second fluorine diffusion layer obtained by diffusing the first fluorine implantation layer and the second fluorine implantation layer.

Thus, as the first fluorine implantation layer is formed in a region of the second region under the second extension implantation layer, the second fluorine diffusion layer is formed by diffusing not only the second fluorine implantation layer but also the first fluorine implantation layer, whereby it is possible to realize the second fluorine diffusion layer having a profile obtained by portions thereof sufficiently overlapping together in a region directly under the second gate electrode.

In a method for producing a semiconductor device in one aspect of the present invention, being a second method for producing a semiconductor device including a plurality of types of transistors, the step (a) further includes a step of forming a second gate insulating film on a second region of the semiconductor region, the second region being of the first conductivity type and being different from the first region; the step (b) includes a step of forming a second gate electrode on the second gate insulating film, the second gate electrode having a gate length longer than that of the first gate electrode; the method includes, after the step (b) and before the steps (c) and (d), a step (f) of performing an ion implantation of an impurity of the second conductivity type using the second gate electrode as a mask to form a second extension implantation layer in a region of the second region under and beside the second gate electrode; the step (d) includes a step of performing an ion implantation of fluorine ions using the second gate electrode as a mask to form a second fluorine implantation layer in a region of the second region under and beside the second gate electrode, and the method includes, after the steps (b) and (f) and before the step (c), a step (g) of forming an insulating film on the first region and the second region so as to cover the first gate electrode and the second gate electrode; the method includes, after the steps (d) and (g) and before the step (c), a step (h) of performing a heat treatment, and includes, after the step (h), a step (i) of etching back the insulating film to form a first sidewall on a side surface of the first gate electrode and the second gate electrode; after the steps (d), (f), (g), (h) and (i), the step (c) performs an ion implantation of the impurity using the first gate electrode and the first sidewall as a mask to form the first extension implantation layer; and the step (e) includes a step of diffusing the second fluorine implantation layer to form a second fluorine diffusion layer so that portions of which overlap together directly under the second gate electrode.

Thus, when producing a semiconductor device including a plurality of types of transistors on a semiconductor region, it is possible with a single heat treatment to form first and second fluorine diffusion layers having profiles obtained by portions thereof overlapping together in regions directly under the first and second gate electrodes, respectively. Thus, it is possible to suppress the NBTI degradation of a plurality of types of transistors without introducing characteristics variations. Particularly, although the gate length of the first gate electrode is longer than that of the second gate electrode, the insulating film, which has been formed in step (e), is present when the heat treatment is performed in step (f), whereby fluorine ions are effectively diffused without outdiffusion, with the insulating film serving as a diffusion-preventing film. As a result, portions of a fluorine diffusion layer can easily be made to overlap together not only in a region directly under the second gate electrode but also in a region directly under the first gate electrode.

It is preferred that the second method for producing a semiconductor device further includes, after the step (f) and before the step (d), a step (j) of performing an ion implantation of fluorine ions using the second gate electrode as a mask to form a third fluorine implantation layer in a region of the second region under and beside the second gate electrode so as to cover a lower side of the second extension implantation layer, wherein the step (e) includes a step of diffusing the second fluorine implantation layer and the third fluorine implantation layer to form the second fluorine diffusion layer.

Thus, as the third fluorine implantation layer is formed in advance in a region of the first region under the first extension implantation layer, the second fluorine diffusion layer is formed by diffusing not only the first fluorine implantation layer but also the third fluorine implantation layer, whereby it is possible to realize a second fluorine diffusion layer having a profile obtained by portions thereof sufficiently overlapping together in a region directly under the second gate electrode.

In a second aspect of the present invention, the fluorine ions are implanted in the step (j) in a direction inclined with respect to an axis perpendicular to a surface of the semiconductor region. Thus, it is possible to easily realize the second fluorine diffusion layer having a profile obtained by portions thereof overlapping together in a region directly under the first gate electrode.

The second method for producing a semiconductor device may include, after the step (c) and before the step (e), a step (k) of forming a second sidewall on a side surface of the first sidewall and then performing an ion implantation of an impurity of the second conductivity type using the second sidewall as a mask to form a first source-drain implantation layer in a region of the first region under and beside the second sidewall so as to be adjacent to the first extension implantation layer and the first fluorine implantation layer and to form a second source-drain implantation layer in a region of the second region under and beside the second sidewall so as to be adjacent to the second extension implantation layer and the second fluorine implantation layer, wherein the step (e) includes a step of forming a first source-drain diffusion layer obtained by diffusing the first source-drain implantation layer and forming a second source-drain diffusion layer obtained by diffusing the second source-drain implantation layer.

As described above, with the semiconductor device and the method for producing the same in one aspect of the present invention, it is possible to realize transistors of which the NBTI degradation can be suppressed.

BRIEF DESCRIPTION OF THE DRAWINGS

FIGS. 7A and 7B are cross-sectional views sequentially showing the steps of producing the semiconductor device of the second embodiment.

FIGS. 9A and 9B are cross-sectional views sequentially showing the steps of producing the semiconductor device of the second embodiment.

FIGS. 10A and 10B are cross-sectional views sequentially showing the steps of producing the semiconductor device of the second embodiment.

FIGS. 15A and 15B are cross-sectional views sequentially showing the steps of producing a semiconductor device according to the third embodiment of the present invention.

FIGS. 16A and 16B are cross-sectional views sequentially showing the steps of producing a semiconductor device according to the third embodiment of the present invention.

FIGS. 19A and 19B are cross-sectional views sequentially showing the steps of producing a semiconductor device according to the fourth embodiment of the present invention.

FIGS. 20A and 20B are cross-sectional views sequentially showing the steps of producing a semiconductor device according to the fourth embodiment of the present invention.

FIGS. 22A and 22B are cross-sectional views sequentially showing the steps of producing a semiconductor device according to a fifth embodiment of the present invention.

FIGS. 24A and 24B are cross-sectional views sequentially showing the steps of producing a semiconductor device according to the fifth embodiment of the present invention.

FIGS. 27A and 27B are cross-sectional views sequentially showing the steps of producing a semiconductor device according to a sixth embodiment of the present invention.

FIGS. 28A and 28B are cross-sectional views sequentially showing the steps of producing a semiconductor device according to the sixth embodiment of the present invention.

FIGS. 30A and 30B are cross-sectional views sequentially showing the steps of producing a semiconductor device according to the sixth embodiment of the present invention.

FIGS. 31A and 31B are cross-sectional views sequentially showing the steps of producing a semiconductor device according to the sixth embodiment of the present invention.

DESCRIPTION OF THE PREFERRED EMBODIMENTS

Embodiments of the present invention will now be described with reference to the drawings.

First Embodiment

First, the structure of a semiconductor device according to a first embodiment of the present invention will be described.

Figure 1:
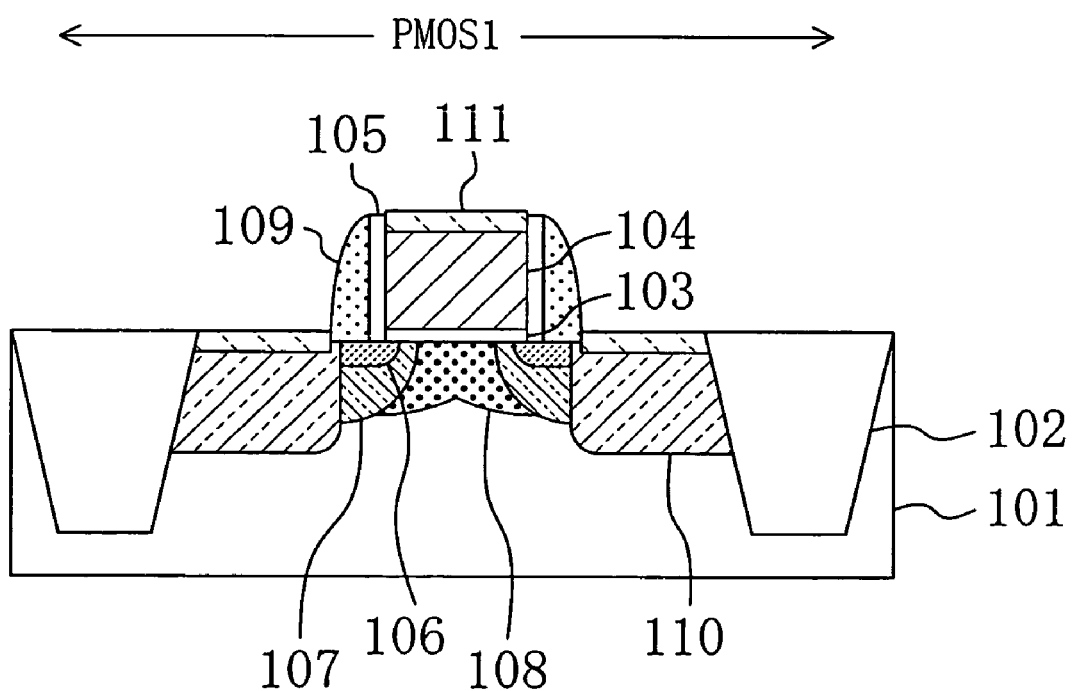
FIG. 1 is a cross-sectional view showing a structure of a semiconductor device according to a first embodiment of the present invention.

FIG. 1 is a cross-sectional view showing the structure of the semiconductor device of the first embodiment. FIG. 1 shows a structure where a p-channel MIS transistor is provided in a p-channel MIS transistor formation region PMOS1 of the substrate.

As shown in FIG. 1, a gate electrode 104 is formed, via a gate insulating film 103, on a region of an n-type semiconductor region 101 surrounded by a device separation 102 being an STI (shallow trench isolation). A first sidewall 105 being a plate-shaped offset sidewall is formed on the side surface of the gate electrode 104. In a region of the n-type semiconductor region 101 under and beside the gate electrode 104 (in the direction from the inside of the gate electrode 104 toward the outside thereof), a p-type extension diffusion layer 106 containing a p-type impurity is formed, and an n-type pocket diffusion layer 107 containing an n-type impurity is formed at a lower position than the p-type extension diffusion layer 106. A fluorine diffusion layer 108 is formed between the n-type pocket diffusion layers 107 in the n-type semiconductor region 101, wherein the fluorine diffusion layer 108 has a profile obtained by portions thereof extending from opposite side surfaces of the n-type pocket diffusion layers 107 and overlapping together in a region directly under the gate electrode 104.

A second sidewall 109 being a silicon nitride film is formed on the first sidewall 105. In a region of the n-type semiconductor region 101 under and beside the second sidewall 109 (in the direction from the second sidewall 109 toward the device separation 102), a p-type source-drain diffusion layer 110 containing a p-type impurity with a higher concentration than that of the p-type extension diffusion layer 106 is formed so as to be adjacent to the p-type extension diffusion layer 106 and the n-type pocket diffusion layer 107. A silicide layer 111 is formed on the gate electrode 104 and the p-type source-drain diffusion layer 110.

A method for producing a semiconductor device according to the first embodiment of the present invention will now be described.

FIGS. 2A to 5B are cross-sectional views sequentially showing the steps of producing the semiconductor device of the first embodiment. FIGS. 2A to 5B show a structure where a p-channel MIS transistor is provided in the p-channel MIS transistor formation region PMOS1 on the substrate.

Figure 2A:
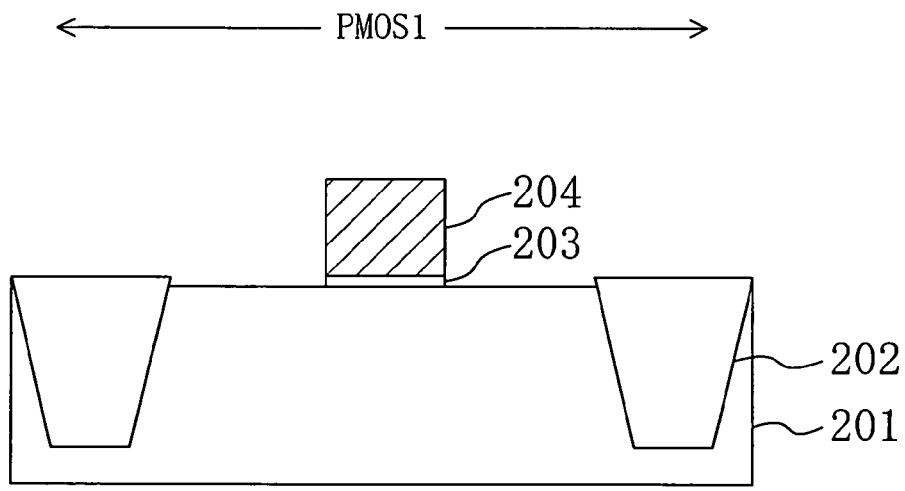
FIGS. 2A and 2B are cross-sectional views sequentially showing the steps of producing the semiconductor device of the first embodiment.

As shown in FIG. 2A, a gate insulating film 203 being an oxide film and a gate electrode 204 being a polysilicon film, for example, are formed on a region of an n-type semiconductor region 201 surrounded by a device separation 202 being STI (shallow trench isolation).

Figure 2B:
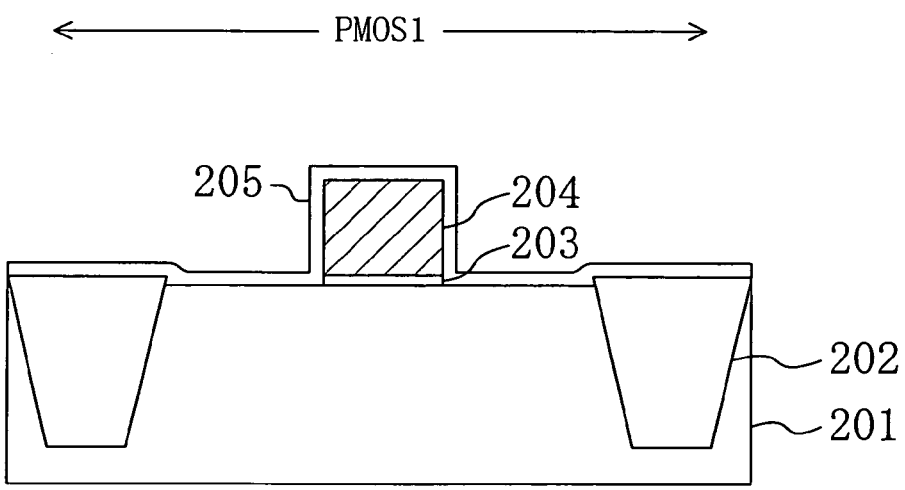

Then, as shown in FIG. 2B, a silicon oxide film (HTO film: High-Temperature-Oxide) 205 is grown to a thickness of 14 nm, for example, on the n-type semiconductor region 201 and the device separation 202 by a CVD (Chemical Vapor Deposition) method.

Figure 3A:
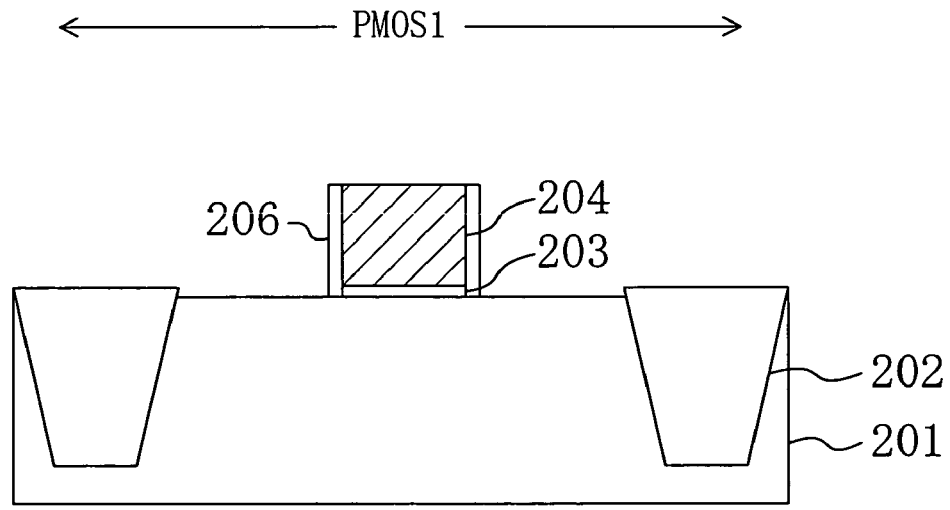
FIGS. 3A and 3B are cross-sectional views sequentially showing the steps of producing the semiconductor device of the first embodiment.

Then, as shown in FIG. 3A, the HTO film 205 is etched back so as to form a first sidewall 206 being the plate-shaped offset sidewall on the side surface of the gate electrode 204.

Figure 3B:
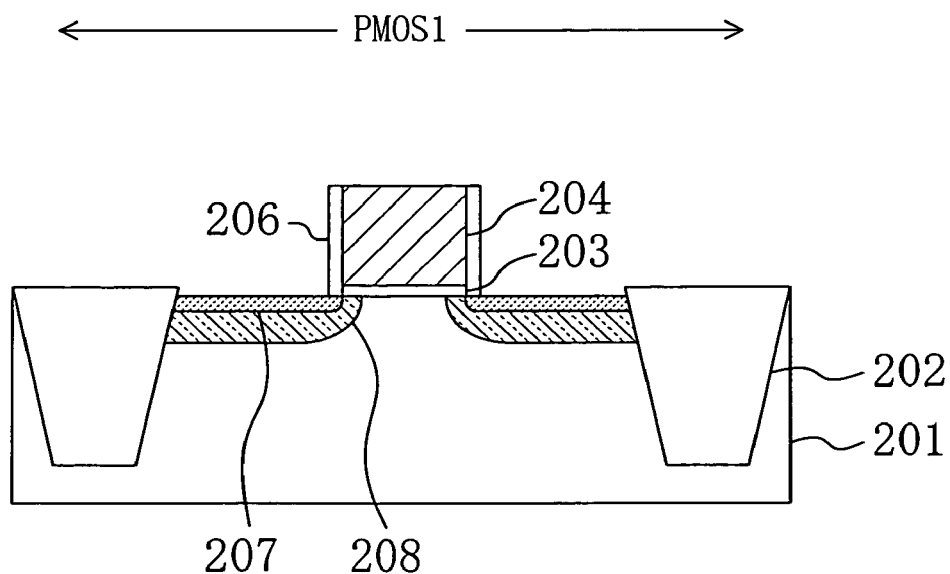

Then, as shown in FIG. 3B, boron ions are implanted using the gate electrode 204 and the first sidewall 206 as a mask and under a condition with an acceleration energy of 0.5 KeV, an implantation dose of $3.0 \times 10^{14}$ ions/cm$^2$ and a tilt angle of 0°, for example, to form a p-type extension implantation layer 207 in a region of the n-type semiconductor region 201 under and beside the gate electrode 204 (in the direction from the inside of the gate electrode 204 toward the outside thereof). Then, phosphorus ions are implanted by four-step rotational implantation using the gate electrode 204 and the first sidewall 206 as a mask and under a condition with an acceleration energy of 30 KeV, an implantation dose of $7.0 \times 10^{12}$ ions/cm$^2$ and a tilt angle of 25°, for example, to form an n-type pocket implantation layer 208 at a lower position than the p-type extension implantation layer 207.

Figure 4A:
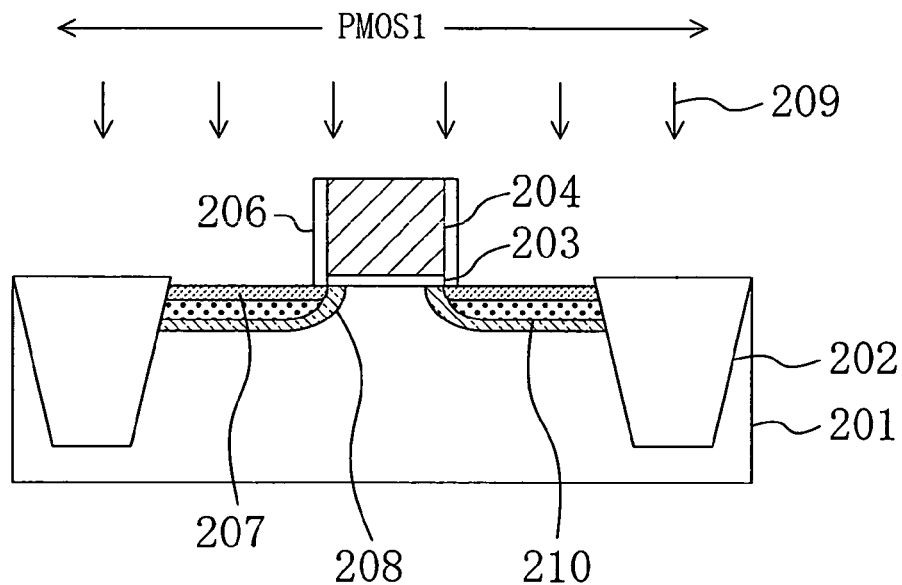
FIGS. 4A and 4B are cross-sectional views sequentially showing the steps of producing the semiconductor device of the first embodiment.

Then, as shown in FIG. 4A, a fluorine ion implantation 209 is performed using the gate electrode 204 and the first sidewall 206 as a mask and under a condition with an acceleration energy of 10 KeV, an implantation dose of $5.0 \times 10^{14}$ ions/cm$^2$ and a tilt angle of 0°, for example, to form a fluorine implantation layer 210 in a region of the n-type pocket implantation layer 208 under the p-type extension implantation layer 207. While the p-type extension implantation layer 207 and the n-type pocket implantation layer 208 are formed and then the fluorine implantation layer 210 is formed in the present embodiment, the present invention is not limited to this order. For example, the p-type extension implantation layer 207 and the n-type pocket implantation layer 208 may be formed after the fluorine implantation layer 210 is formed.

Figure 4B:
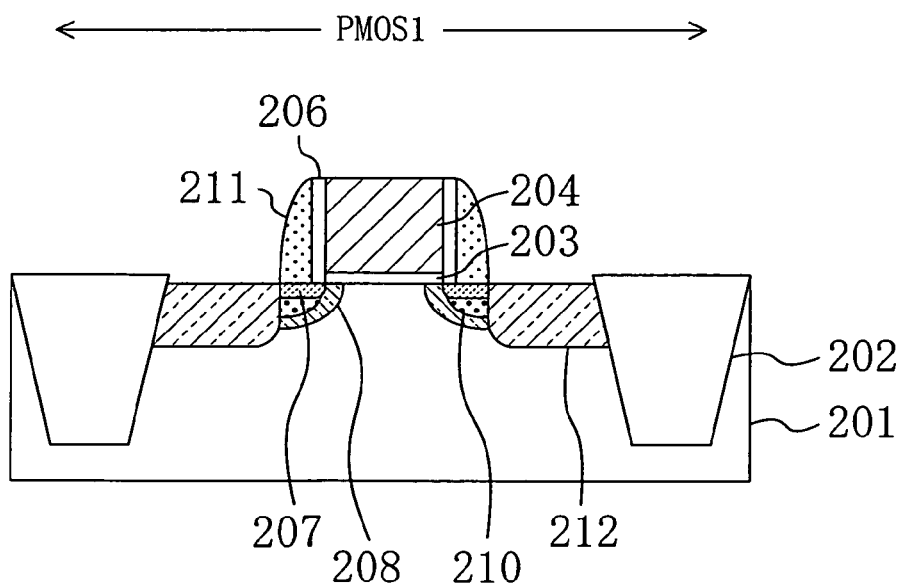

Then, as shown in FIG. 4B, a silicon nitride film, for example, is grown across the entire surface of the n-type semiconductor region 201 and then etched back to form a second sidewall 211 being a silicon nitride film on the side surface of the first sidewall 206. Then, boron ions are implanted using the gate electrode 204, the first sidewall 206 and the second sidewall 211 as a mask and under a condition with an acceleration energy of 2 KeV, an implantation dose of $4.0 \times 10^{15}$ ions/cm$^2$ and a tilt angle of 7°, for example, to form a p-type source-drain implantation layer 212 containing a p-type impurity with a higher concentration than that of the p-type extension implantation layer 207 in a region of the n-type semiconductor region 201 under and beside the second sidewall 211 (in the direction from the second sidewall 211 toward the device separation 202) so as to be adjacent to the p-type extension implantation layer 207 and the n-type pocket implantation layer 208.

Figure 5A:
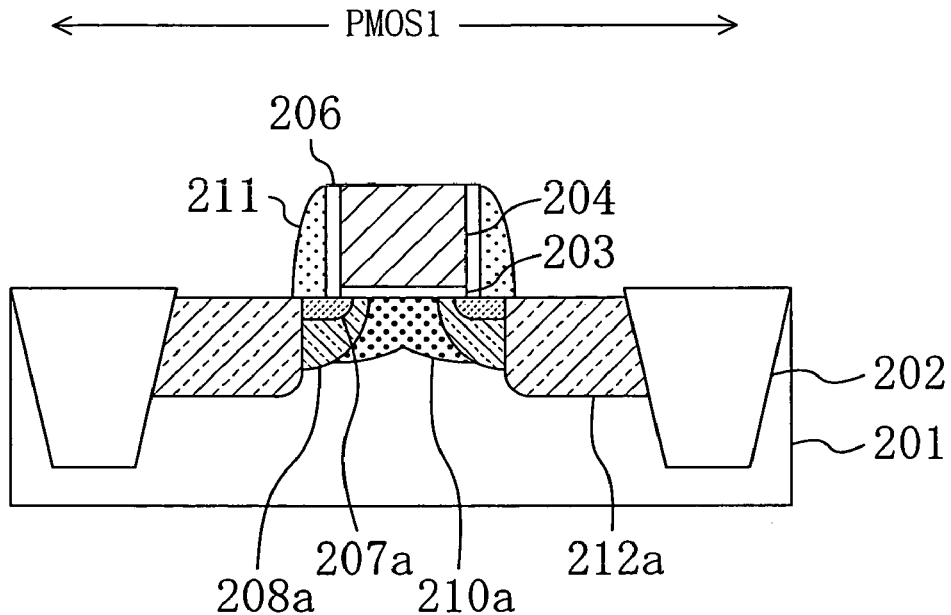
FIGS. 5A and 5B are cross-sectional views sequentially showing the steps of producing the semiconductor device of the first embodiment.

Then, as shown in FIG. 5A, a 1,050° C., 0-second spike annealing process is performed using RTA to diffuse the fluorine implantation layer 210, thus forming a fluorine diffusion layer 210a, wherein the fluorine diffusion layer 210a has a profile obtained by portions thereof extending from opposite side surfaces of an n-type pocket diffusion layer 208a and overlapping together in a region directly under the gate electrode 204. At the same time, this step activates the p-type extension implantation layer 207, the n-type pocket implantation layer 208 and the p-type source-drain implantation layer 212, thus forming a p-type extension diffusion layer 207a, the n-type pocket diffusion layer 208a and a p-type source-drain diffusion layer 212a.

With this step, since the gate length of the gate electrode 204 has been sufficiently shortened by the miniaturization of semiconductor devices, it is possible with a single heat treatment to form the fluorine diffusion layer 210a having a profile obtained by portions thereof sufficiently overlapping together in a region directly under the gate electrode 204. Thus, it is possible to suppress the NBTI degradation.

Figure 5B:
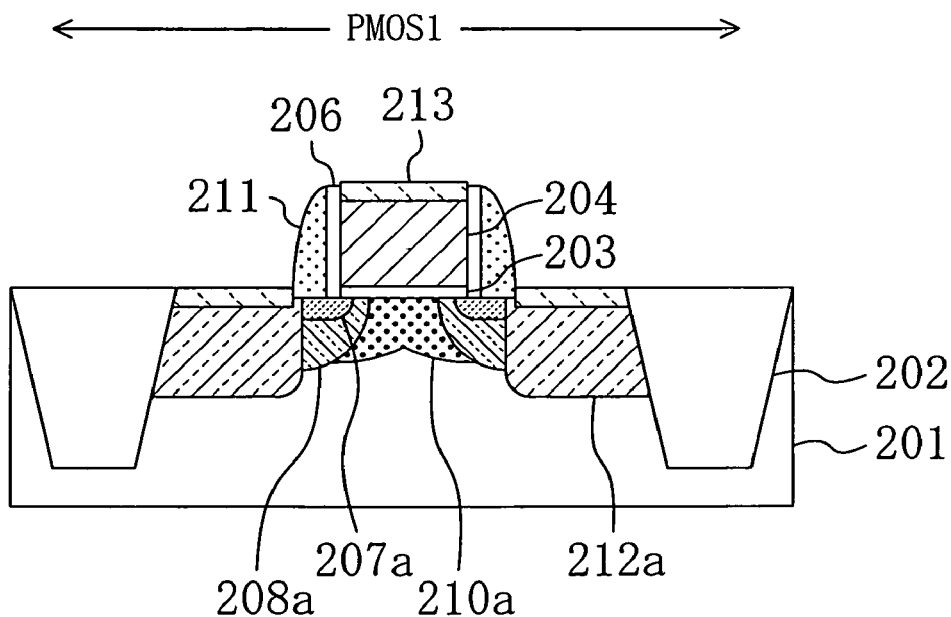

Then, as shown in FIG. 5B, a silicide layer 213 is formed on the gate electrode 204 and the p-type source-drain diffusion layer 212a.

Second Embodiment

First, the structure of a semiconductor device according to a second embodiment of the present invention will be described.

Figure 6:
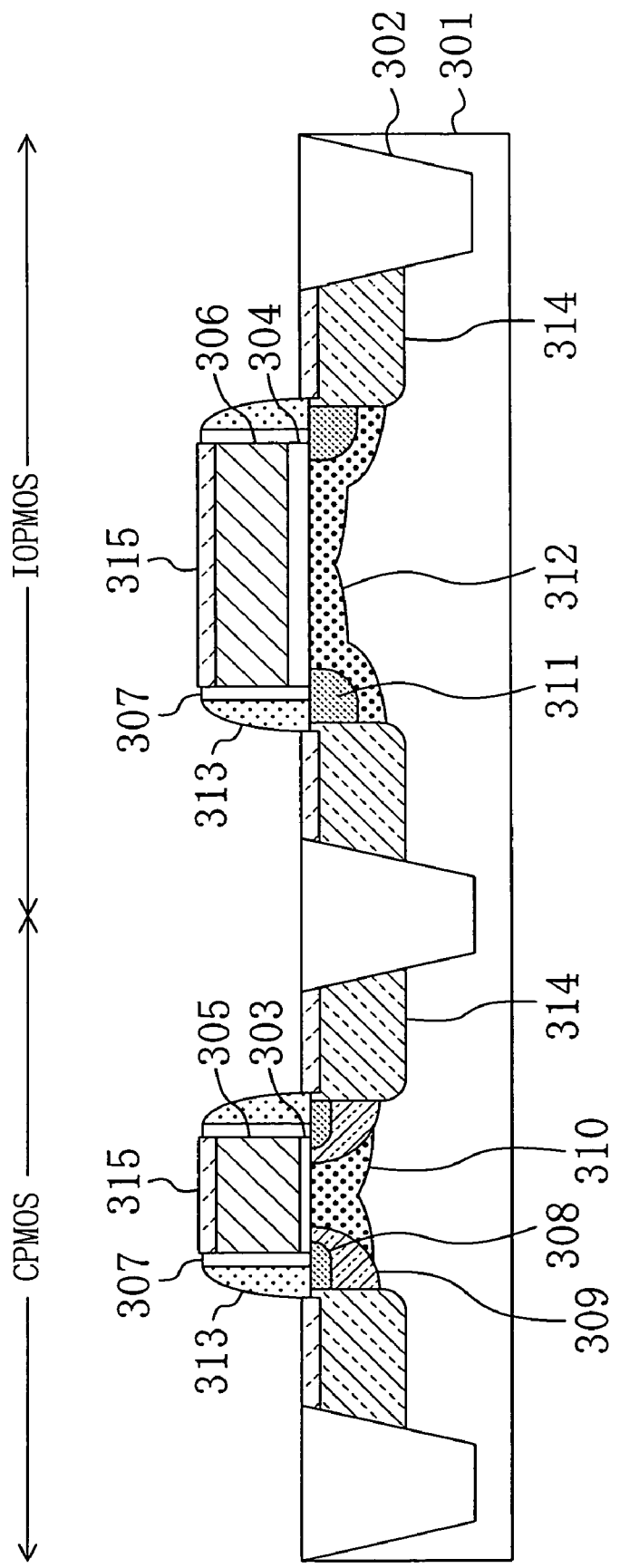
FIG. 6 is a cross-sectional view showing a structure of a semiconductor device according to a second embodiment of the present invention.

FIG. 6 is a cross-sectional view showing a structure of a semiconductor device according to a second embodiment of the present invention. FIG. 6 shows a structure where a p-channel MIS transistor is provided on the substrate in an internal circuit formation region CPMOS (e.g., a region for forming an internal transistor, which receives a relatively low power supply voltage at the gate thereof to perform arithmetic operations), and a p-channel MIS transistor is provided on the substrate in a peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

As shown in FIG. 6, in the internal circuit formation region CPMOS, an internal transistor gate electrode 305 is formed, via an internal transistor gate insulating film 303, on a region of an n-type semiconductor region 301 surrounded by a device separation 302 being STI (shallow trench isolation). A first sidewall 307 being a plate-shaped offset sidewall is formed on the side surface of the internal transistor gate electrode 305. In a region of the n-type semiconductor region 301 under and beside the internal transistor gate electrode 305 (in the direction from the inside of the internal transistor gate electrode 305 toward the outside thereof), an internal transistor p-type extension diffusion layer 308 containing a p-type impurity is formed, and an internal transistor n-type pocket diffusion layer 309 containing an n-type impurity is formed at a lower position than the internal transistor p-type extension diffusion layer 308. An internal transistor fluorine diffusion layer 310 is formed between the internal transistor n-type pocket diffusion layers 309 in the n-type semiconductor region 301, wherein the internal transistor fluorine diffusion layer 310 has a profile obtained by portions thereof extending from opposite side surfaces of the internal transistor n-type pocket diffusion layer 309 and overlapping together in a region directly under the internal transistor gate electrode 305.

A second sidewall 313 being a silicon nitride film is formed on the side surface of the first sidewall 307, and a p-type source-drain diffusion layer 314 containing a p-type impurity with a higher concentration than that of the internal transistor p-type extension diffusion layer 308 is formed in a region of the n-type semiconductor region 301 under and beside the second sidewall 313 (in the direction from the second sidewall 313 toward the device separation 302) so as to be adjacent to the internal transistor p-type extension diffusion layer 308 and the internal transistor n-type pocket diffusion layer 309. A silicide layer 315 is formed on the internal transistor gate electrode 305 and the p-type source-drain diffusion layer 314.

In the peripheral circuit formation region IOPMOS, a peripheral transistor gate electrode 306 is formed, via a peripheral transistor gate insulating film 304 thicker than the internal transistor gate insulating film 303, on a region of the n-type semiconductor region 301 surrounded by the device separation 302 being STI (shallow trench isolation). The first sidewall 307 being a plate-shaped offset sidewall is formed on the side surface of the peripheral transistor gate electrode 306. A peripheral transistor p-type extension diffusion layer 311 containing a p-type impurity is formed in a region of the n-type semiconductor region 301 under and beside the peripheral transistor gate electrode 306 (in the direction from the inside of the peripheral transistor gate electrode 306 toward the outside thereof). A peripheral transistor fluorine diffusion layer 312 is formed in a region of the n-type semiconductor region 301 between the peripheral transistor p-type extension diffusion layers 311 and in a region under the peripheral transistor p-type extension diffusion layer 311, wherein the peripheral transistor fluorine diffusion layer 312 has a profile obtained by portions thereof extending from opposite side surfaces of the peripheral transistor n-type pocket diffusion layer 311 and overlapping together in a region directly under the peripheral transistor gate electrode 306.

The second sidewall 313 being a silicon nitride film is formed on the side surface of the first sidewall 307, and the p-type source-drain diffusion layer 314 containing a p-type impurity with a higher concentration than that of the peripheral transistor p-type extension diffusion layer 311 is formed in a region of the n-type semiconductor region 301 under and beside the second sidewall 313 (in the direction from the second sidewall 313 toward the device separation 302). The silicide layer 315 is formed on the peripheral transistor gate electrode 306 and the p-type source-drain diffusion layer 314.

A method for producing a semiconductor device according to the second embodiment of the present invention will now be described.

FIGS. 7A to 11 are cross-sectional views sequentially showing the steps of producing the semiconductor device of the second embodiment. FIGS. 7A to 11 show a structure where a p-channel MIS transistor is provided on the substrate in the internal circuit formation region CPMOS (e.g., a region for forming an internal transistor, which receives a relatively low power supply voltage at the gate thereof to perform arithmetic operations), and a p-channel MIS transistor is provided on the substrate in the peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

First, as shown in FIG. 7A, an internal transistor gate insulating film 403 being an oxide film, for example, is formed in the internal circuit formation region CPMOS, which is a region of an n-type semiconductor region 401 surrounded by a device separation 402 being STI (shallow trench isolation), and a peripheral transistor gate insulating film 404 thicker than the internal transistor gate insulating film 403 is formed in the peripheral circuit formation region IOPMOS, which is another such region. A gate electrode formation film 405 being a polysilicon film is formed on the device separation 402, the internal transistor gate insulating film 403 and the peripheral transistor gate insulating film 404.

Then, as shown in FIG. 7B, the internal transistor gate insulating film 403, the peripheral transistor gate insulating film 404 and the gate electrode formation film 405 are patterned by using an etching method. Thus, an internal transistor gate electrode 406 and a peripheral transistor gate electrode 407 are obtained from the gate electrode formation film 405.

Figures 8A, 8B:
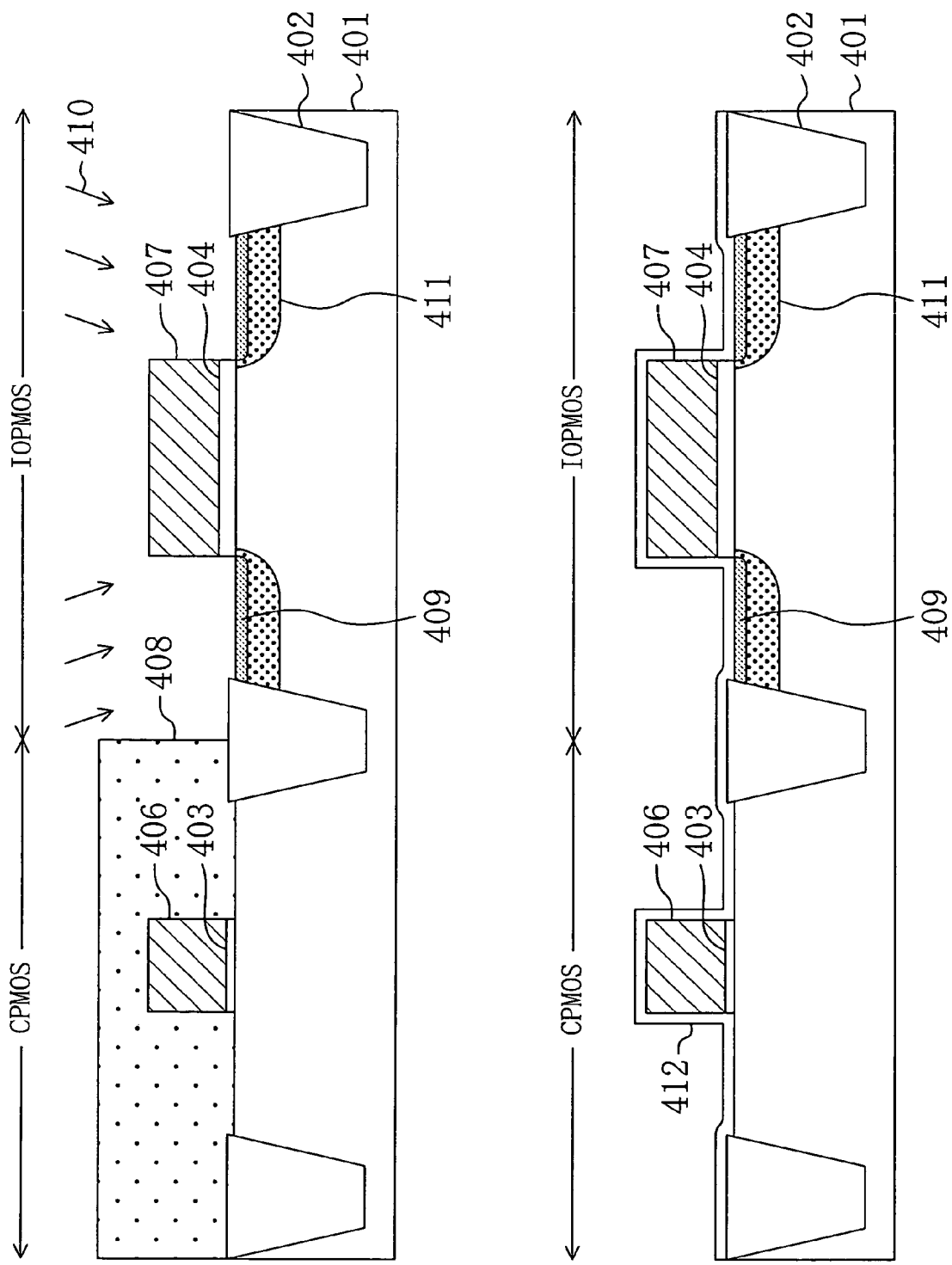
FIGS. 8A and 8B are cross-sectional views sequentially showing the steps of producing the semiconductor device of the second embodiment.

Then, as shown in FIG. 8A, a first resist pattern 408 is formed to cover an internal transistor formation region CPMOS, and then $BF_2$ ions are implanted by four-step rotational implantation into a peripheral transistor formation region IOPMOS using the peripheral transistor gate electrode 407 as a mask and under a condition with an acceleration energy of 45 KeV, an implantation dose of $1.2 \times 10^{13}$ ions/cm$^2$ and a tilt angle of 7°, for example, to form a peripheral transistor p-type extension implantation layer 409 in a region of the n-type semiconductor region 401 under and beside the peripheral transistor gate electrode 407 (in the direction from the inside of the peripheral transistor gate electrode 407 toward the outside thereof). Then, a fluorine ion implantation 410 is performed under a condition with an acceleration energy of 10 KeV, an implantation dose of $1.0 \times 10^{15}$ ions/cm$^2$ and a tilt angle of 7°, for example, to form a peripheral transistor fluorine implantation layer 411. It is preferred that the ion implantation 410 is performed at an inclined angle with respect to an axis perpendicular to the surface of the n-type semiconductor region 401, whereby the peripheral transistor fluorine implantation layer 411 can be formed deep into a region directly under the peripheral transistor gate electrode 407. However, the ion implantation 410 may be performed in a direction perpendicular to the surface of the n-type semiconductor region 401.

Then, as shown in FIG. 8B, after the first resist pattern 408 is removed, an HTO film 412 is grown to a thickness of 14 nm across the entire surface of the n-type semiconductor region 401 so as to cover the internal transistor gate electrode 406 and the peripheral transistor gate electrode 407.

Then, as shown in FIG. 9A, the HTO film 412 is etched back so as to form a first sidewall 413 being a plate-shaped offset sidewall on the side surface of the internal transistor gate electrode 406 and the peripheral transistor gate electrode 407. Then, a second resist pattern 414 is formed to cover the peripheral transistor formation region IOPMOS, and then boron ions are implanted into the internal transistor formation region CPMOS using the internal transistor gate electrode 406 and the first sidewall 413 as a mask and under a condition with an acceleration energy of 0.5 KeV, an implantation dose of $3.0 \times 10^{14}$ ions/cm$^2$ and a tilt angle of 0°, for example, to form an internal transistor p-type extension implantation layer 415 in a region of the n-type semiconductor region 401 under and beside the internal transistor gate electrode 406 (in the direction from the inside of the internal transistor gate electrode 406 toward the outside thereof). Then, phosphorus ions are implanted by four-step rotational implantation under a condition with an acceleration energy of 30 KeV, an implantation dose of $7.0 \times 10^{12}$ ions/cm$^2$ and a tilt angle of 25°, for example, to form an internal transistor n-type pocket implantation layer 416 at a lower position than the internal transistor p-type extension implantation layer 415.

Then, as shown in FIG. 9B, a fluorine ion implantation 417 is performed using the internal transistor gate electrode 406 and the first sidewall 413 as a mask and under a condition with an acceleration energy of 10 KeV, a dose of $5.0 \times 10^{14}$ ions/cm$^2$ and a tilt angle of 0°, for example, to form an internal transistor fluorine implantation layer 418 in a region of the internal transistor n-type pocket implantation layer 416 under the p-type extension implantation layer 415. While the internal transistor p-type extension implantation layer 415 and the internal transistor n-type pocket implantation layer 416 are formed and then the internal transistor fluorine implantation layer 418 is formed in the present embodiment, the present invention is not limited to this order. For example, the internal transistor p-type extension implantation layer 415 and the internal transistor n-type pocket implantation layer 416 may be formed after the internal transistor fluorine implantation layer 418 is formed.

Then, as shown in FIG. 10A, after the second resist pattern 414 is removed, a silicon nitride film is grown across the entire surface of the n-type semiconductor region 401 and then etched back to form a second sidewall 419 being a silicon nitride film on the side surface of the first sidewall 413. Then, boron ions are implanted using the internal transistor gate electrode 406, the peripheral transistor gate electrode 407 and the first sidewall 413 and the second sidewall 419 as a mask and under a condition with an acceleration energy of 2 KeV, an implantation dose of $4.0 \times 10^{15}$ ions/cm$^2$ and a tilt angle of 7°, for example. As a result, in the internal circuit formation region CPMOS, a p-type source-drain implantation layer 420 is formed in a region of the n-type semiconductor region 401 under and beside the second sidewall 419 (in the direction from the second sidewall 419 toward the device separation 402) so as to be adjacent to an internal transistor p-type extension diffusion layer 415, the internal transistor fluorine implantation layer 418 and the internal transistor n-type pocket implantation layer 416, whereas in the peripheral circuit formation region IOPMOS, the p-type source-drain implantation layer 420 is formed in a region of the n-type semiconductor region 401 under and beside the second sidewall 419 (in the direction from the second sidewall 419 toward the device separation 402) so as to be adjacent to the peripheral transistor p-type extension implantation layer 409 and the peripheral transistor fluorine implantation layer 411. The p-type source-drain implantation layer 420 includes a p-type impurity with a higher concentration than that of the internal transistor p-type extension implantation layer 415, and includes a p-type impurity with a higher concentration than that of the peripheral transistor p-type extension implantation layer 409.

Then, as shown in FIG. 10B, a 1,050° C., 0-second spike annealing process is performed using RTA to form an internal transistor fluorine diffusion layer 418a having a profile obtained by portions of the internal transistor fluorine implantation layer 418 being diffused into, and overlapping together in, a region directly under the internal transistor gate electrode 406. At the same time, this step forms a peripheral transistor fluorine diffusion layer 411a having a profile obtained by portions of the peripheral transistor fluorine implantation layer 411 being diffused into, and overlapping together in, a region directly under the peripheral transistor gate electrode 407. At the same time, this step activates the internal transistor p-type extension implantation layer 415, the internal transistor n-type pocket implantation layer 416, the peripheral transistor p-type extension implantation layer 409 and the p-type source-drain implantation layer 420 to form an internal transistor p-type extension diffusion layer 415a, an internal transistor n-type pocket diffusion layer 416a, a peripheral transistor p-type extension diffusion layer 409a and a p-type source-drain diffusion layer 420a.

With this step, since the gate length of the internal transistor gate electrode 406 has been sufficiently shortened by the miniaturization of semiconductor devices, it is possible with a single heat treatment to realize the internal transistor fluorine diffusion layer 418a having a profile obtained by portions thereof sufficiently overlapping together in a region directly under the internal transistor gate electrode 406. Although the gate length of the peripheral transistor gate electrode 407 is longer than that of the internal transistor gate electrode 406, the concentration of the peripheral transistor fluorine implantation layer 411 is higher than that of the internal transistor fluorine implantation layer 418, whereby it is possible with a single heat treatment of this step to realize the peripheral transistor fluorine diffusion layer 411a having a profile obtained by portions thereof being diffused into, and sufficiently overlapping together in, a region directly under the peripheral transistor gate electrode 407. Thus, it is possible to suppress the NBTI degradation in internal-transistors and peripheral transistors.

Figure 11:
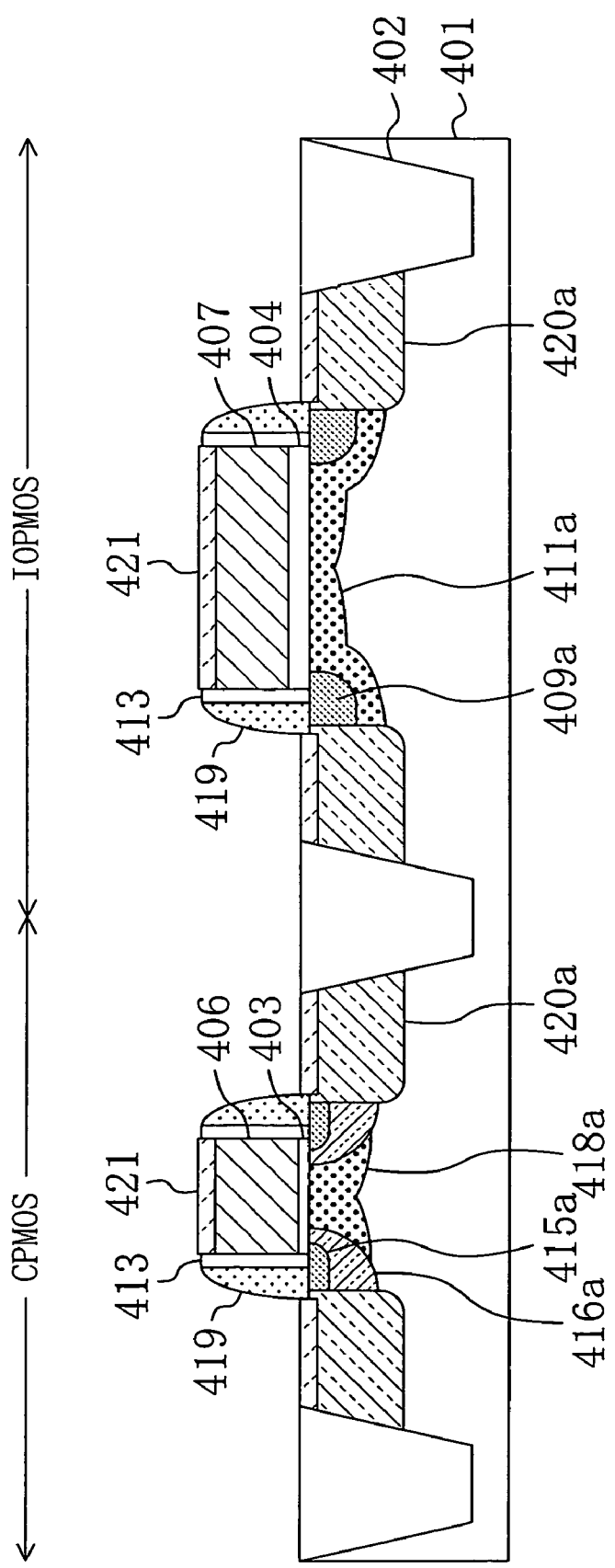
FIG. 11 is a cross-sectional view showing a step of producing the semiconductor device of the second embodiment.

Then, as shown in FIG. 11, a silicide layer 421 is formed on the internal transistor gate electrode 406, the peripheral transistor gate electrode 407 and the p-type source-drain diffusion layer 420a.

Third Embodiment

A method for producing a semiconductor device according to a third embodiment of the present invention will now be described.

FIGS. 12A to 16B are cross-sectional views sequentially showing the steps of producing the semiconductor device of the third embodiment. FIGS. 12A to 16B show a structure where a p-channel MIS transistor is provided on the substrate in the internal circuit formation region CPMOS (e.g., a region for forming an internal transistor, which receives a relatively low power supply voltage at the gate thereof to perform arithmetic operations), and a p-channel MIS transistor is provided on the substrate in the peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

Figure 12A:
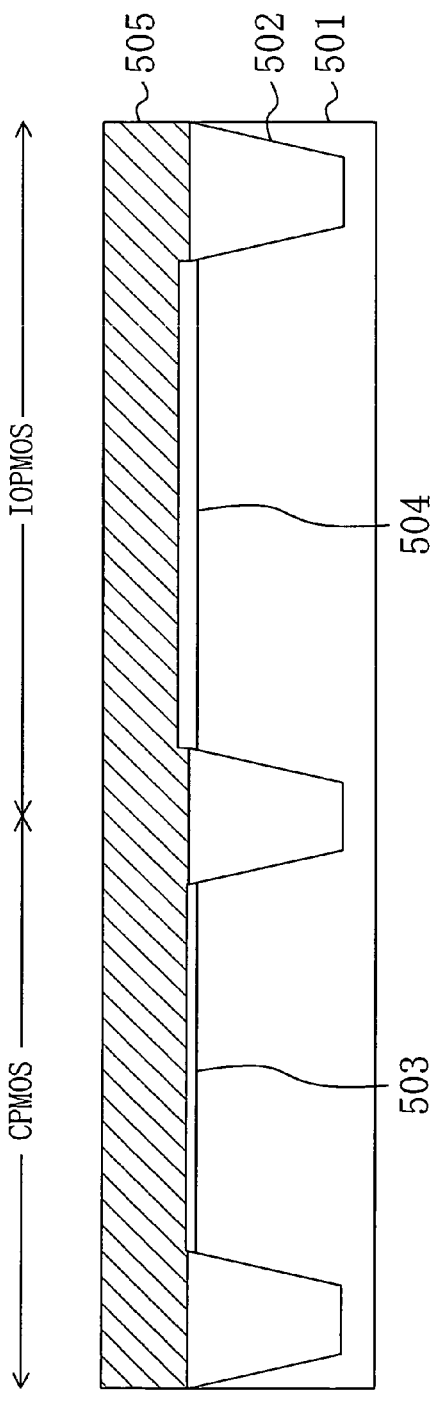
FIGS. 12A and 12B are cross-sectional views sequentially showing the steps of producing a semiconductor device according to a third embodiment of the present invention.

First, as shown in FIG. 12A, an internal transistor gate insulating film 503 being an oxide film, for example, is formed in the internal circuit formation region CPMOS, which is a region of an n-type semiconductor region 501 surrounded by a device separation 502 being STI (shallow trench isolation), and a peripheral transistor gate insulating film 504 thicker than the internal transistor gate insulating film 503 is formed in the peripheral circuit formation region IOPMOS, which is another such region. A gate electrode formation film 505 being a polysilicon film is formed on the device separation 502, the internal transistor gate insulating film 503 and the peripheral transistor gate insulating film 504.

Figure 12B:
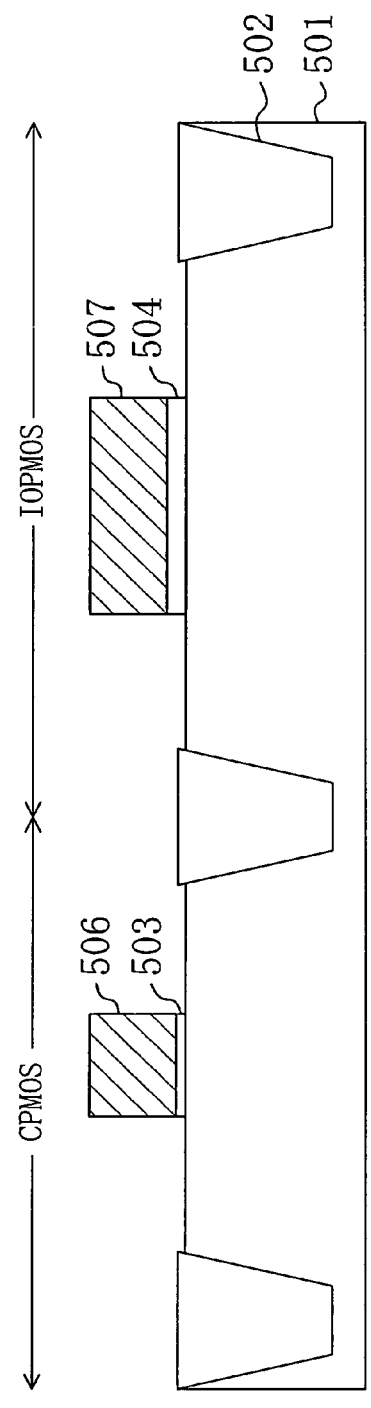

Then, as shown in FIG. 12B, the internal transistor gate insulating film 503, the peripheral transistor gate insulating film 504 and the gate electrode formation film 505 are patterned by using an etching method. Thus, an internal transistor gate electrode 506 and a peripheral transistor gate electrode 507 are obtained from the gate electrode formation film 505.

Figure 13A:
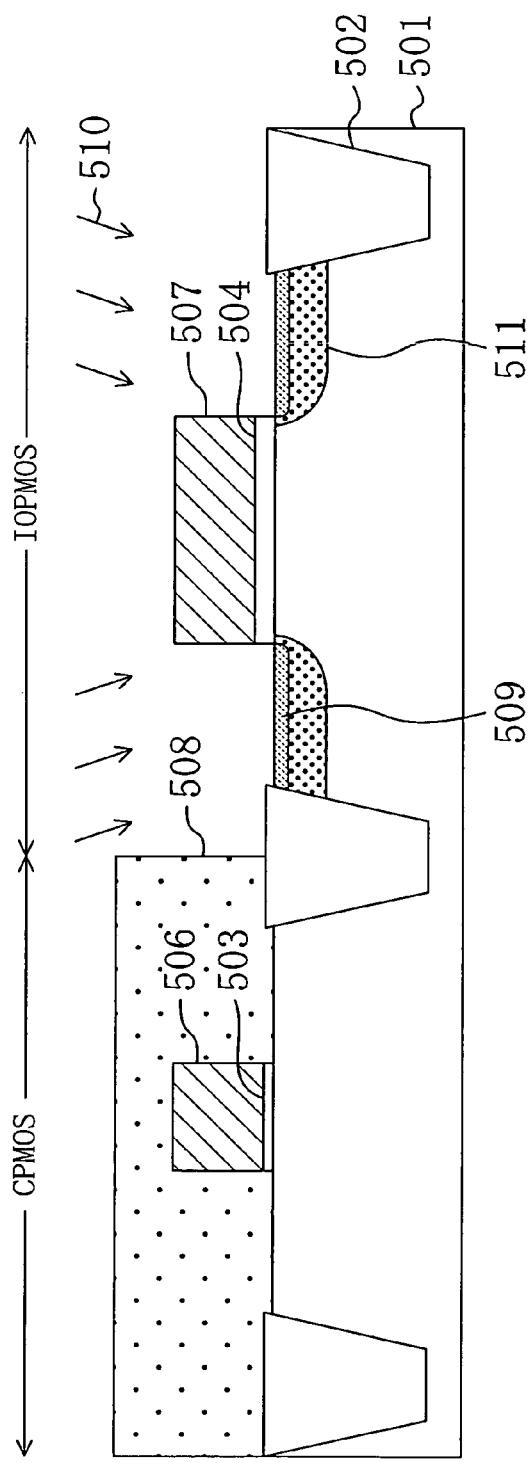
FIGS. 13A and 13B are cross-sectional views sequentially showing the steps of producing a semiconductor device according to the third embodiment of the present invention.

Then, as shown in FIG. 13A, a first resist pattern 508 is formed to cover the internal transistor formation region CPMOS, and then $BF_2$ ions are implanted by four-step rotational implantation into the peripheral transistor formation region IOPMOS using the peripheral transistor gate electrode 507 as a mask and under a condition with an acceleration energy of 45 KeV, an implantation dose of $1.2\times10^{13}$ ions/cm$^2$ and a tilt angle of 7°, for example, to form a peripheral transistor p-type extension implantation layer 509 in a region of the n-type semiconductor region 501 under and beside the peripheral transistor gate electrode 507 (in the direction from the inside of the peripheral transistor gate electrode 507 toward the outside thereof). Then, a fluorine ion implantation 510 is performed under a condition with an acceleration energy of 10 KeV, an implantation dose of $5.0\times10^{14}$ ions/cm$^2$ and a tilt angle of 7°, for example, to form a peripheral transistor fluorine implantation layer 511. It is preferred that the ion implantation 510 is performed at an inclined angle with respect to an axis perpendicular to the surface of the n-type semiconductor region 501, whereby the peripheral transistor fluorine implantation layer 511 can be formed deep into a region directly under the peripheral transistor gate electrode 507. However, the ion implantation 510 may be performed in a direction perpendicular to the surface of the n-type semiconductor region 501.

Figure 13B:
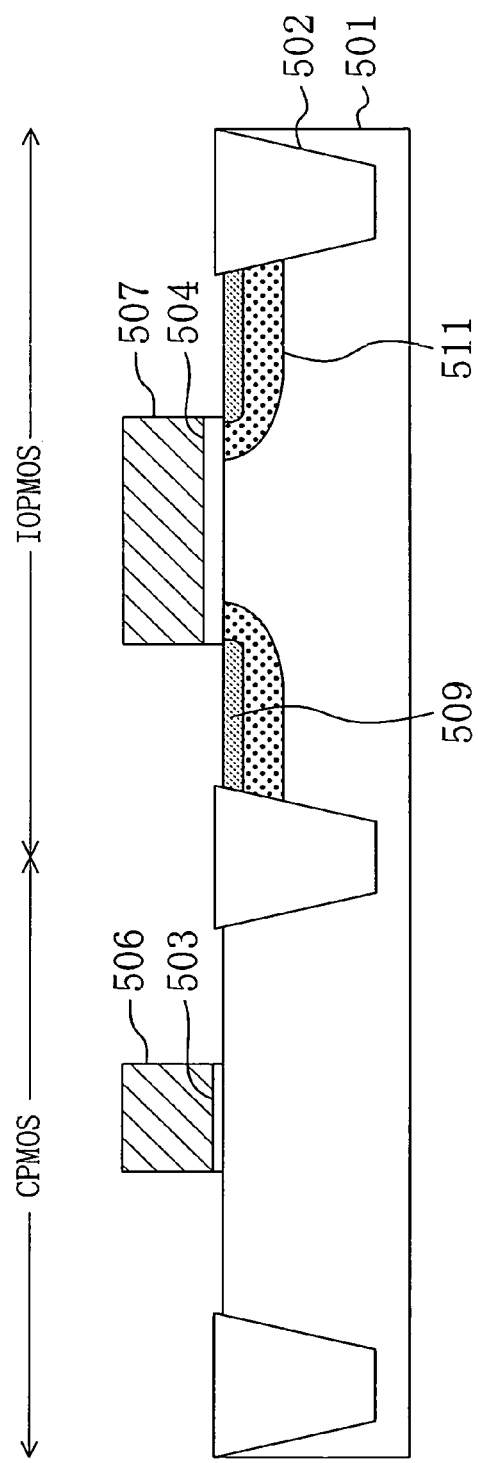

Then, as shown in FIG. 13B, after the first resist pattern 508 is removed, a 950° C., 0-second spike annealing process is performed using RTA to diffuse the peripheral transistor p-type extension implantation layer 509 and the peripheral transistor fluorine implantation layer 511 into a region directly under the peripheral transistor gate electrode 507. Because of this process, when the peripheral transistor fluorine implantation layer 511 is diffused in the step shown in FIG. 16A to be described later so that portions thereof overlap together in a region directly under the peripheral transistor gate electrode 507, portions of a peripheral transistor fluorine diffusion layer 511a to be described later more easily overlap together in the region directly under the peripheral transistor gate electrode 507. Thus, this step is effective for making portions of the peripheral transistor fluorine diffusion layer 511a overlap together in a region directly under the peripheral transistor gate electrode 507 having a greater gate length.

Figure 14A:
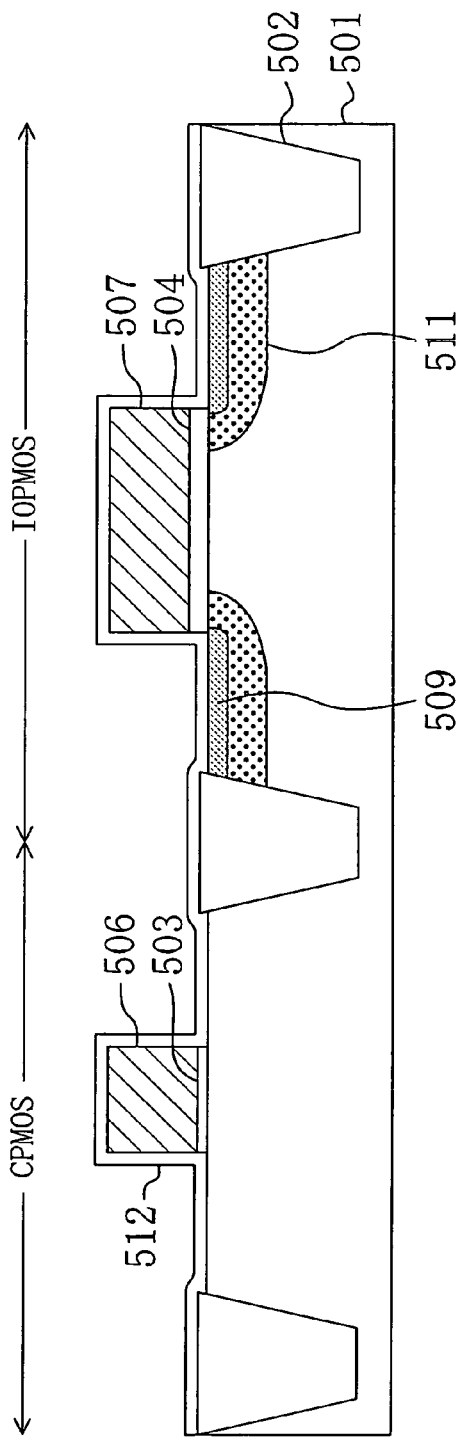
FIGS. 14A and 14B are cross-sectional views sequentially showing the steps of producing a semiconductor device according to the third embodiment of the present invention.

Then, as shown in FIG. 14A, an HTO film 512 is grown to 14 nm, for example, across the entire surface of the n-type semiconductor region 501 so as to cover the internal transistor gate electrode 506 and the peripheral transistor gate electrode 507.

Figure 14B:
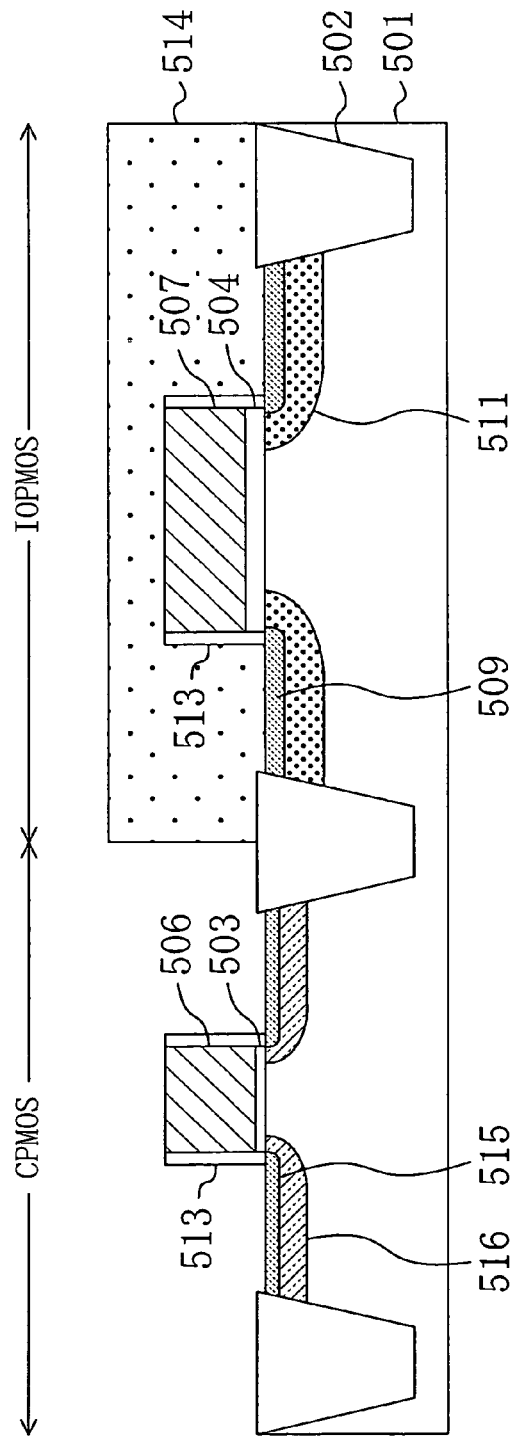

Then, as shown in FIG. 14B, the HTO film 512 is etched back so as to form a first sidewall 513 being a plate-shaped offset sidewall on the side surface of the internal transistor gate electrode 506 and the peripheral transistor gate electrode 507. Then, a second resist pattern 514 is formed to cover the peripheral transistor formation region IOPMOS, and then boron ions are implanted into the internal transistor formation region CPMOS using the internal transistor gate electrode 506 and the first sidewall 513 as a mask and under a condition with an acceleration energy of 0.5 KeV, an implantation dose of $3.0\times10^{14}$ ions/cm$^2$ and a tilt angle of 0°, for example, to form an internal transistor p-type extension implantation layer 515 in a region of the n-type semiconductor region 501 under and beside the internal transistor gate electrode 506 (in the direction from the inside of the internal transistor gate electrode 506 toward the outside thereof). Then, phosphorus ions are implanted by four-step rotational implantation under a condition with an acceleration energy of 30 KeV, an implantation dose of $7.0\times10^{12}$ ions/cm$^2$ and a tilt angle of 25°, for example, to form an internal transistor n-type pocket implantation layer 516 at a lower position than the internal transistor p-type extension implantation layer 515.

Then, as shown in FIG. 15A, a fluorine ion implantation 517 is performed using the internal transistor gate electrode 506 and the first sidewall 513 as a mask and under a condition with an acceleration energy of 10 KeV, a dose of $5.0\times10^{14}$ ions/cm$^2$ and a tilt angle of 0°, for example, to form an internal transistor fluorine implantation layer 518 in a region the internal transistor n-type pocket implantation layer 516 under the p-type extension implantation layer 515. While the internal transistor p-type extension implantation layer 515 and the internal transistor n-type pocket implantation layer 516 are formed and then the internal transistor fluorine implantation layer 518 is formed in the present embodiment, the present invention is not limited to this order. For example, the internal transistor p-type extension implantation layer 515 and the internal transistor n-type pocket implantation layer 516 may be formed after the internal transistor fluorine implantation layer 518 is formed.

Then, as shown in FIG. 15B, after the second resist pattern 514 is removed, a silicon nitride film is grown across the entire surface of the n-type semiconductor region 501 and then etched back to form a second sidewall 519 being a silicon nitride film on the side surface of the first sidewall 513. Then, boron ions are implanted using the internal transistor gate electrode 506, the peripheral transistor gate electrode 507, the first sidewall 513 and the second sidewall 519 as a mask and under a condition with an acceleration energy of 2 KeV, an implantation dose of $4.0\times10^{15}$ ions/cm$^2$ and a tilt angle of 7°, for example. As a result, in the internal circuit formation region CPMOS, a p-type source-drain implantation layer 520 is formed in a region of the n-type semiconductor region 501 under and beside the second sidewall 519 (in the direction from the second sidewall 519 toward the device separation 502) so as to be adjacent to the internal transistor p-type extension implantation layer 515, the internal transistor fluorine implantation layer 518 and the internal transistor n-type pocket implantation layer 516, whereas in the peripheral circuit formation region IOPMOS, the p-type source-drain implantation layer 520 is formed in a region of the n-type semiconductor region 501 under and beside the second sidewall 519 (in the direction from the second sidewall 519 toward the device separation 502) so as to be adjacent to the peripheral transistor p-type extension implantation layer 509 and the peripheral transistor fluorine implantation layer 511. The p-type source-drain implantation layer 520 includes a p-type impurity with a higher concentration than that of the internal transistor p-type extension implantation layer 515, and includes a p-type impurity with a higher concentration than that of the peripheral transistor p-type extension implantation layer 509.

Then, as shown in FIG. 16A, a 1,050° C., 0-second spike annealing process is performed using RTA to form an internal transistor fluorine diffusion layer 518a having a profile obtained by portions of the internal transistor fluorine implantation layer 518 being diffused into, and overlapping together in, a region directly under the internal transistor gate electrode 506. At the same time, this step forms the peripheral transistor fluorine diffusion layer 511a having a profile obtained by portions of the peripheral transistor fluorine implantation layer 511 being diffused into, and overlapping together in, a region directly under the peripheral transistor gate electrode 507. At the same time, this step activates the internal transistor p-type extension implantation layer 515, the internal transistor n-type pocket implantation layer 516, the peripheral transistor p-type extension implantation layer 509 and the p-type source-drain implantation layer 520 to form an internal transistor p-type extension diffusion layer 515*a*, an internal transistor n-type pocket diffusion layer 516*a*, a peripheral transistor p-type extension diffusion layer 509*a* and a p-type source-drain diffusion layer 520*a*.

With this step, since the gate length of the internal transistor gate electrode 506 has been sufficiently shortened by the miniaturization of semiconductor devices, it is possible with a single heat treatment to realize the internal transistor fluorine diffusion layer 518*a* having a profile obtained by portions thereof sufficiently overlapping together in a region directly under the internal transistor gate electrode 506. Although the gate length of the peripheral transistor gate electrode 507 is longer than that of the internal transistor gate electrode 506, the peripheral transistor fluorine implantation layer 511 is previously diffused in the step shown in FIG. 13B, whereby it is possible with this step to realize the peripheral transistor fluorine diffusion layer 511*a* having a profile obtained by portions thereof being diffused into, and sufficiently overlapping together in, a region directly under the peripheral transistor gate electrode 507. Thus, it is possible to suppress the NBTI degradation in internal transistors and peripheral transistors. The peripheral transistor fluorine implantation layer 511 is previously diffused in the step shown in FIG. 13B and is then further diffused in this step. Therefore, even if the concentration of fluorine implanted into the peripheral transistor fluorine implantation layer 511 in the step shown in FIG. 13A is lower than that of the second embodiment, it is possible to form the peripheral transistor fluorine diffusion layer 511*a* having a profile obtained by portions thereof being diffused into, and sufficiently overlapping together in, a region directly under the peripheral transistor gate electrode 507.

Then, as shown in FIG. 16B, a silicide layer 521 is formed on the internal transistor gate electrode 506, the peripheral transistor gate electrode 507 and the p-type source-drain diffusion layer 520*a*.

Fourth Embodiment

A method for producing a semiconductor device according to the fourth embodiment of the present invention will now be described.

FIGS. 17A to 21B are cross-sectional views sequentially showing the steps of producing the semiconductor device of the fourth embodiment. FIGS. 17A to 21B show a structure where a p-channel MIS transistor is provided on the substrate in the internal circuit formation region CPMOS (e.g., a region for forming an internal transistor, which receives a relatively low power supply voltage at the gate thereof to perform arithmetic operations), and p-channel MIS transistor is provided on the substrate in the peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

Figure 17A:
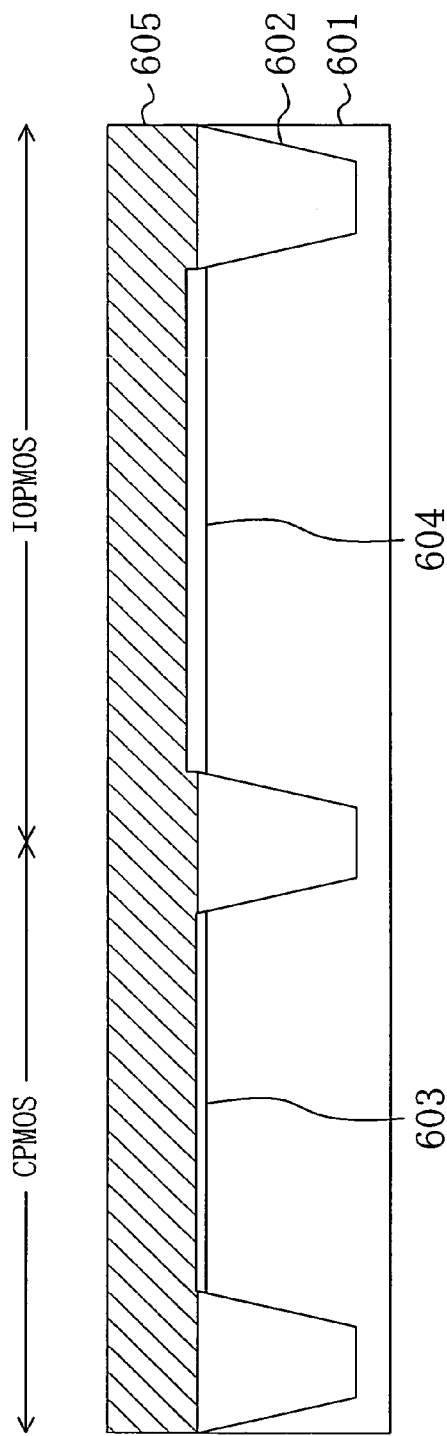
FIGS. 17A and 17B are cross-sectional views sequentially showing the steps of producing a semiconductor device according to a fourth embodiment of the present invention.

First, as shown in FIG. 17A, an internal transistor gate insulating film 603 being an oxide film, for example, is formed in the internal circuit formation region CPMOS, which is a region of an n-type semiconductor region 601 surrounded by a device separation 602 being STI (shallow trench isolation), and a peripheral transistor gate insulating film 604 thicker than the internal transistor gate insulating film 603 is formed in the peripheral circuit formation region IOPMOS, which is another such region. A gate electrode formation film 605 being a polysilicon film is formed on the device separation 602, the internal transistor gate insulating film 603 and the peripheral transistor gate insulating film 604.

Figure 17B:
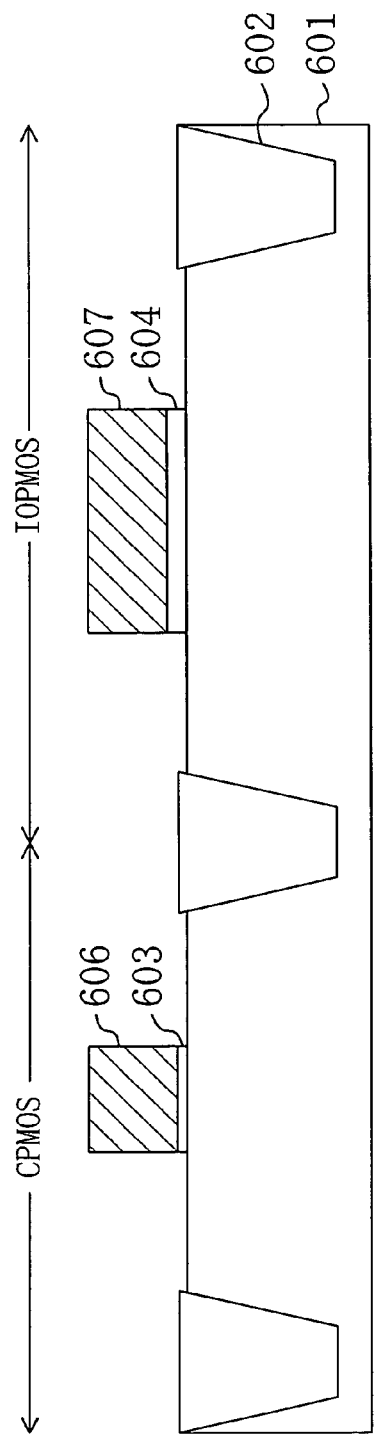

Then, as shown in FIG. 17B, the internal transistor gate insulating film 603, the peripheral transistor gate insulating film 604 and the gate electrode formation film 605 are patterned by using an etching method. Thus, an internal transistor gate electrode 606 and a peripheral transistor gate electrode 607 are obtained from the gate electrode formation film 605.

Figures 18A, 18B:
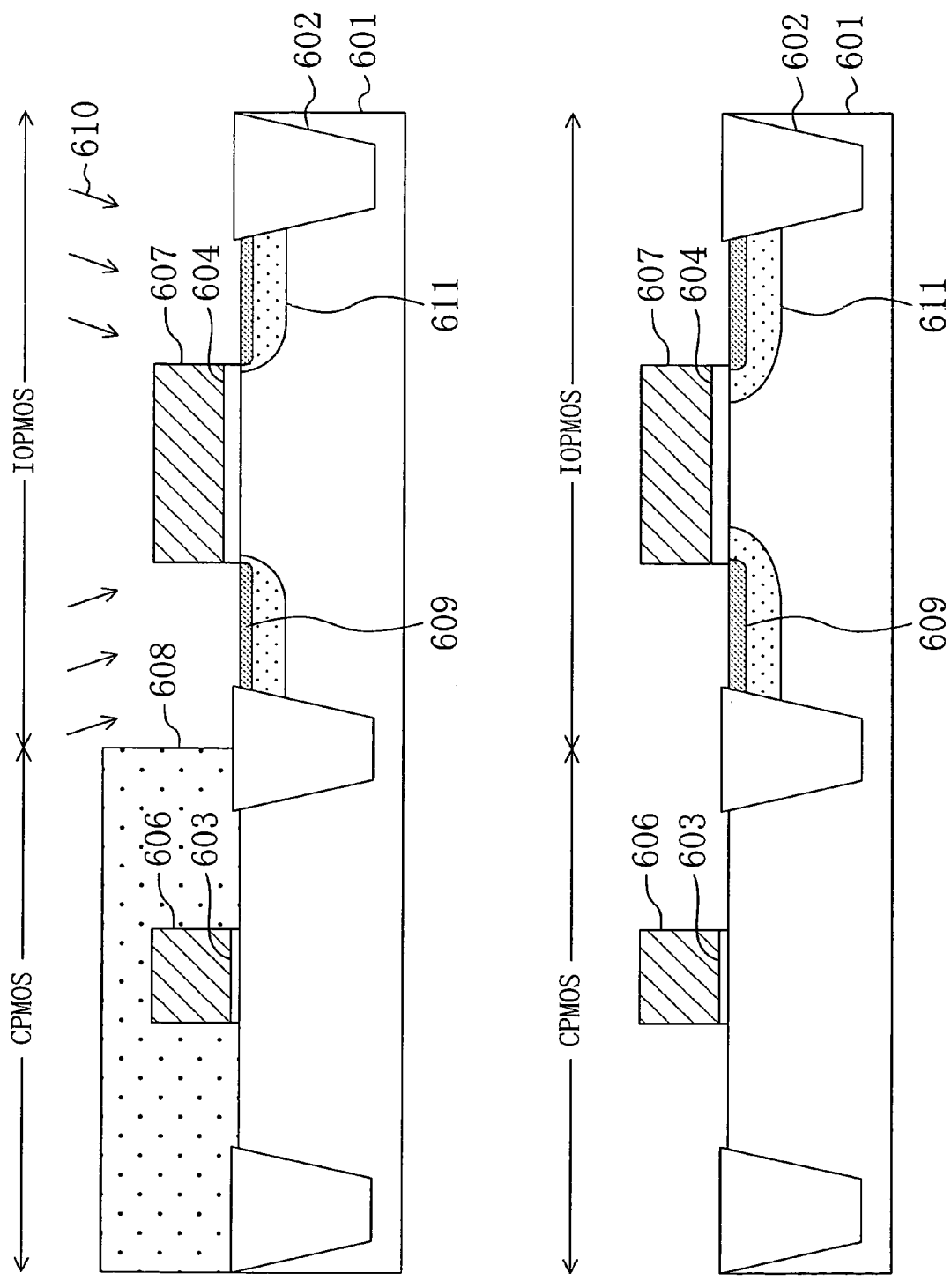
FIGS. 18A and 18B are cross-sectional views sequentially showing the steps of producing a semiconductor device according to the fourth embodiment of the present invention.

Then, as shown in FIG. 18A, a first resist pattern 608 is formed to cover the internal transistor formation region CPMOS, and then $BF_2$ ions are implanted by four-step rotational implantation into the peripheral transistor formation region IOPMOS using the peripheral transistor gate electrode 607 as a mask and under a condition with an acceleration energy of 45 KeV, an implantation dose of $1.2 \times 10^{13}$ ions/cm$^2$ and a tilt angle of 7°, for example, to form a peripheral transistor p-type extension implantation layer 609 in a region of the n-type semiconductor region 601 under and beside the peripheral transistor gate electrode 607 (in the direction from the inside of the peripheral transistor gate electrode 607 toward the outside thereof). Then, a fluorine ion implantation 610 is performed under a condition with an acceleration energy of 10 KeV, an implantation dose of $5.0 \times 10^{14}$ ions/cm$^2$ and a tilt angle of 7°, for example, to form a peripheral transistor fluorine implantation layer 611. It is preferred that the ion implantation 610 is performed at an inclined angle with respect to an axis perpendicular to the surface of the n-type semiconductor region 601, whereby the peripheral transistor fluorine implantation layer 611 can be formed deep into a region directly under the peripheral transistor gate electrode 607. However, the ion implantation 610 may be performed in a direction perpendicular to the surface of the n-type semiconductor region 601.

Then, as shown in FIG. 18B, after the first resist pattern 608 is removed, a 950° C., 0-second spike annealing process is performed using RTA to diffuse the peripheral transistor p-type extension implantation layer 609 and the peripheral transistor fluorine implantation layer 611 into a region directly under the peripheral transistor gate electrode 607. Because of this process, when the peripheral transistor fluorine implantation layer 611 is diffused in the step shown in FIG. 21A to be described later so that portions thereof overlap together in a region directly under the peripheral transistor gate electrode 607, portions of a peripheral transistor fluorine diffusion layer 611*a* to be described later more easily overlap together in the region directly under the peripheral transistor gate electrode 607. Thus, this step is effective for making portions of the peripheral transistor fluorine diffusion layer 611*a* overlap together in a region directly under the peripheral transistor gate electrode 607 having a greater gate length.

Then, as shown in FIG. 19A, an HTO film 612 is grown to 14 nm, for example, across the entire surface of the n-type semiconductor region 601 so as to cover the internal transistor gate electrode 606 and the peripheral transistor gate electrode 607.

Then, as shown in FIG. 19B, the HTO film 612 is etched back so as to form a first sidewall 613 being a plate-shaped offset sidewall on the side surface of the internal transistor gate electrode 606 and the peripheral transistor gate electrode 607. Then, a second resist pattern 614 is formed to cover the peripheral transistor formation region IOPMOS, and then boron ions are implanted into the internal transistor formation region CPMOS using the internal transistor gate electrode 606 and the first sidewall 613 as a mask and under a condition with an acceleration energy of 0.5 KeV, an implantation dose of $3.0 \times 10^{14}$ ions/cm$^2$ and a tilt angle of 0°, for example, to form an internal transistor p-type extension implantation layer 615 in a region of the n-type semiconductor region 601 under and beside the internal transistor gate electrode 606 (in the direction from the inside of the internal transistor gate electrode 606 toward the outside thereof). Then, phosphorus ions are implanted by four-step rotational implantation under a condition with an acceleration energy of 30 KeV, an implantation dose of $7.0 \times 10^{12}$ ions/cm$^2$ and a tilt angle of 25°, for example, to form an internal transistor n-type pocket implantation layer 616 at a lower position than the internal transistor p-type extension implantation layer 615.

Then, as shown in FIG. 20A, after the second resist pattern 614 is removed, a fluorine ion implantation 617 is performed using the internal transistor gate electrode 606, the peripheral transistor gate electrode 607 and the first sidewall 613 as a mask and under a condition with an acceleration energy of 10 KeV, a dose of $5.0 \times 10^{14}$ ions/cm$^2$ and a tilt angle of 0°, for example, to form a fluorine implantation layer 618 in a region of the internal transistor n-type pocket implantation layer 616 under the p-type extension implantation layer 615 and in a region of the peripheral transistor fluorine implantation layer 611 under the p-type extension implantation layer 609. While the internal transistor p-type extension implantation layer 615 and the internal transistor n-type pocket implantation layer 616 are formed and then the fluorine implantation layer 618 is formed in the present embodiment, the present invention is not limited to this order. For example, the internal transistor p-type extension implantation layer 615 and the internal transistor n-type pocket implantation layer 616 may be formed after the fluorine implantation layer 618 is formed.

Then, as shown in FIG. 20B, a silicon nitride film is grown across the entire surface of the n-type semiconductor region 601 and then etched back to form a second sidewall 619 being a silicon nitride film on the side surface of the first sidewall 613. Then, boron ions are implanted using the internal transistor gate electrode 606, the peripheral transistor gate electrode 607, the first sidewall 613 and the second sidewall 619 as a mask and under a condition with an acceleration energy of 2 KeV, an implantation dose of $4.0 \times 10^{15}$ ions/cm$^2$ and a tilt angle of 7°, for example. As a result, in the internal circuit formation region CPMOS, a p-type source-drain implantation layer 620 is formed in a region of the n-type semiconductor region 601 under and beside the second sidewall 619 (in the direction from the second sidewall 619 toward the device separation 602) so as to be adjacent to the internal transistor p-type extension implantation layer 615, the fluorine implantation layer 618 and the internal transistor n-type pocket implantation layer 616, whereas in the peripheral circuit formation region IOPMOS, the p-type source-drain implantation layer 620 is formed in a region of the n-type semiconductor region 601 under and beside the second sidewall 619 (in the direction from the second sidewall 619 toward the device separation 602) so as to be adjacent to the peripheral transistor p-type extension implantation layer 609, the fluorine implantation layer 618 and the peripheral transistor fluorine implantation layer 611. The p-type source-drain implantation layer 620 includes a p-type impurity with a higher concentration than that of the internal transistor p-type extension implantation layer 615, and includes a p-type impurity with a higher concentration than that of the peripheral transistor p-type extension implantation layer 609.

Figure 21A:
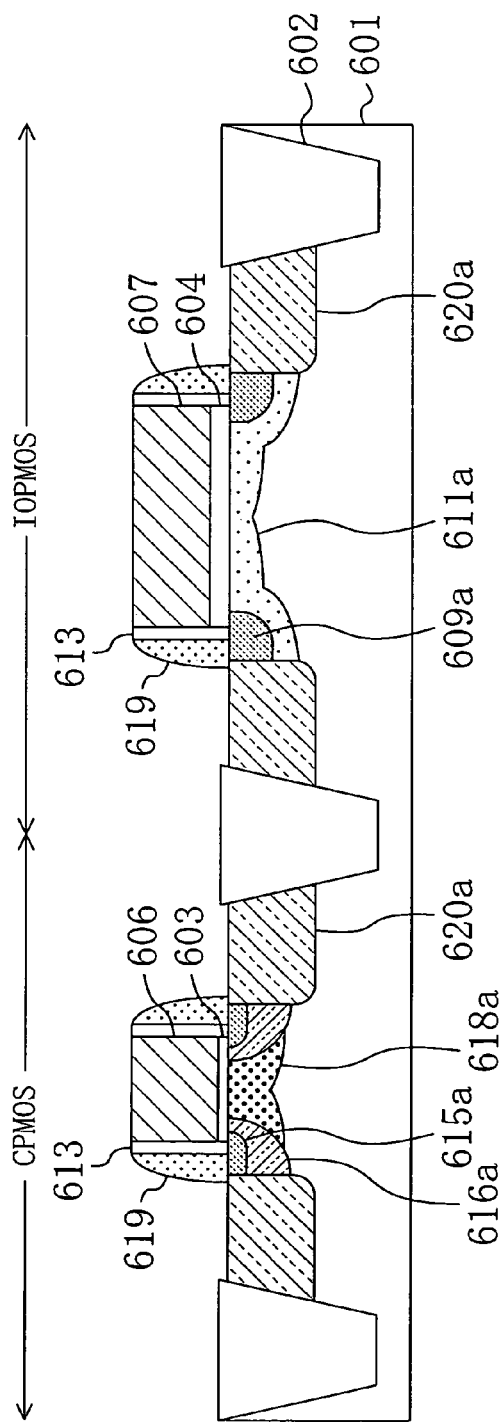
FIGS. 21A and 21B are cross-sectional views sequentially showing the steps of producing a semiconductor device according to the fourth embodiment of the present invention.

Then, as shown in FIG. 21A, a 1,050° C., 0-second spike annealing process is performed using RTA to form an internal transistor fluorine diffusion layer 618a having a profile obtained by portions of the fluorine implantation layer 618 being diffused into, and overlapping together in, a region directly under the internal transistor gate electrode 606, in the internal circuit formation region CPMOS. At the same time, this step forms the peripheral transistor fluorine diffusion layer 611a having a profile obtained by portions of the peripheral transistor fluorine implantation layer 611 and the fluorine implantation layer 618 being diffused into, and overlapping together in, a region directly under the peripheral transistor gate electrode 607, in the peripheral circuit formation region IOPMOS. At the same time, this step activates the internal transistor p-type extension implantation layer 615, the internal transistor n-type pocket implantation layer 616, the peripheral transistor p-type extension implantation layer 609 and the p-type source-drain implantation layer 620 to form an internal transistor p-type extension diffusion layer 615a, an internal transistor n-type pocket diffusion layer 616a, a peripheral transistor p-type extension diffusion layer 609a and a p-type source-drain diffusion layer 620a.

With this step, since the gate length of the internal transistor gate electrode 606 has been sufficiently shortened by the miniaturization of semiconductor devices, it is possible with a single heat treatment to realize the internal transistor fluorine diffusion layer 618a having a profile obtained by portions thereof sufficiently overlapping together in a region directly under the internal transistor gate electrode 606. Although the gate length the peripheral transistor gate electrode 607 is longer than that of the internal transistor gate electrode 606, the peripheral transistor fluorine implantation layer 611 is previously diffused in the step shown in FIG. 18B and the fluorine implantation layer 618 is further formed in the peripheral transistor fluorine implantation layer 611 in the step shown in FIG. 20A, whereby it is possible with this step to realize the peripheral transistor fluorine diffusion layer 611a having a profile obtained by portions thereof being diffused into, and sufficiently overlapping together in, a region directly under the peripheral transistor gate electrode 607. Thus, it is possible to suppress the NBTI degradation in internal transistors and peripheral transistors. The peripheral transistor fluorine implantation layer 611 is previously diffused in the step shown in FIG. 18B and then the fluorine implantation layer 618 is formed in the step shown in FIG. 20A. Therefore, even if the concentration of fluorine implanted into the peripheral transistor fluorine implantation layer 611 in the step shown in FIG. 18A is lower than that of the second embodiment, it is possible to form the peripheral transistor fluorine diffusion layer 611a having a profile obtained by portions thereof being diffused into, and sufficiently overlapping together in, a region directly under the peripheral transistor gate electrode 607.

Figure 21B:
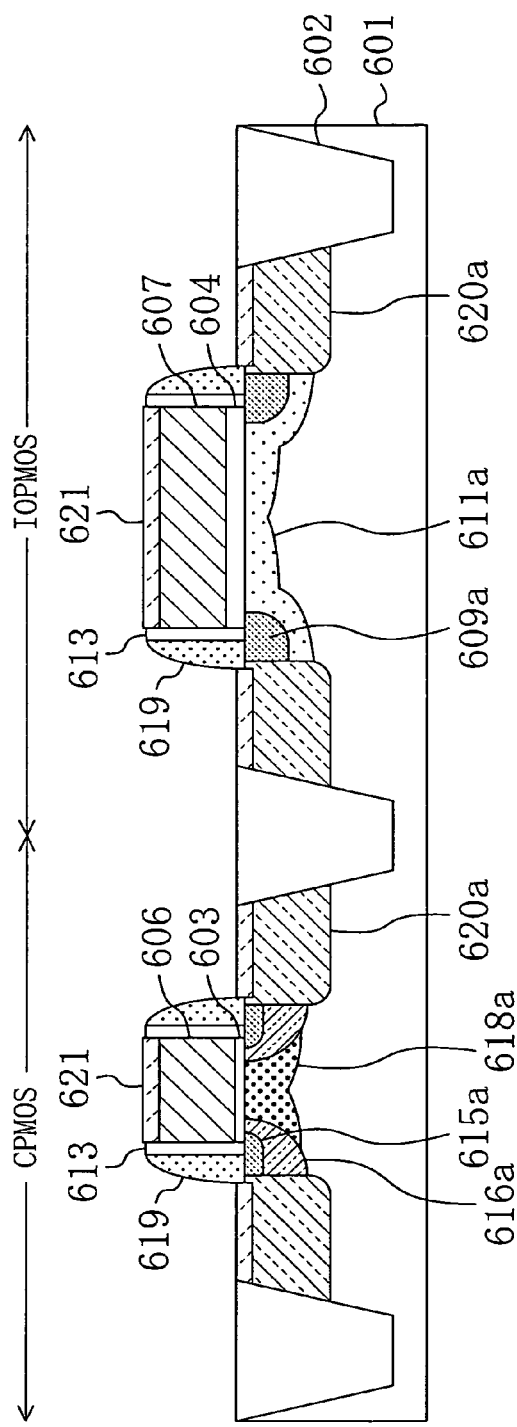

Then, as shown in FIG. 21B, a silicide layer 621 is formed on the internal transistor gate electrode 606, the peripheral transistor gate electrode 607 and the p-type source-drain diffusion layer 620a.

Fifth Embodiment

A method for producing a semiconductor device according to a fifth embodiment of the present invention will now be described.

FIGS. 22A to 26B are cross-sectional views sequentially showing the steps of producing the semiconductor device of the fifth embodiment. FIGS. 22A to 26B show a structure where a p-channel MIS transistor is provided on the substrate in the internal circuit formation region CPMOS (e.g., a region for forming an internal transistor, which receives a relatively low power supply voltage at the gate thereof to perform arithmetic operations), and a p-channel MIS transistor is provided on the substrate in the peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

First, as shown in FIG. 22A, an internal transistor gate insulating film 703 being an oxide film, for example, is formed in the internal circuit formation region CPMOS, which is a region of an n-type semiconductor region 701 surrounded by a device separation 702 being STI (shallow trench isolation), and a peripheral transistor gate insulating film 704 thicker than the internal transistor gate insulating film 703 is formed in the peripheral circuit formation region IOPMOS, which is another such region. Then, a gate electrode formation film 705 being a polysilicon film is formed on the device separation 702, the internal transistor gate insulating film 703 and the peripheral transistor gate insulating film 704.

Then, as shown in FIG. 22B, the internal transistor gate insulating film 703, the peripheral transistor gate insulating film 704 and the gate electrode formation film 705 are patterned by using an etching method. Thus, an internal transistor gate electrode 706 and a peripheral transistor gate electrode 707 are obtained from the gate electrode formation film 705.

Figures 23A, 23B:
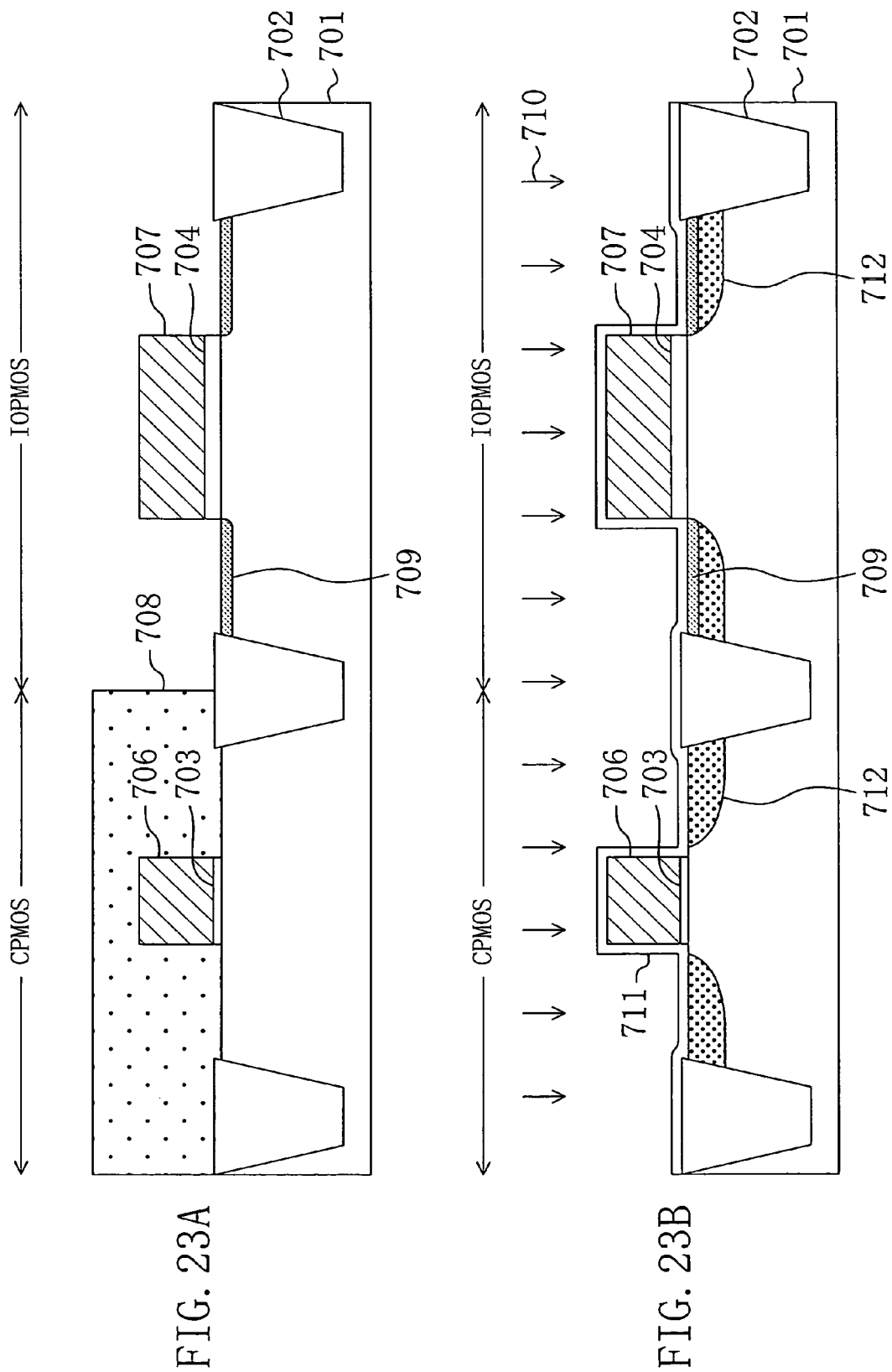
FIGS. 23A and 23B are cross-sectional views sequentially showing the steps of producing a semiconductor device according to the fifth embodiment of the present invention.

Then, as shown in FIG. 23A, a first resist pattern 708 is formed to cover the internal transistor formation region CPMOS, and then $BF_2$ ions are implanted by four-step rotational implantation into the peripheral transistor formation region IOPMOS using the peripheral transistor gate electrode 707 as a mask and under a condition with an acceleration energy of 45 KeV, an implantation dose of $1.2\times10^{13}$ ions/cm$^2$ and a tilt angle of 7°, for example, to form a peripheral transistor p-type extension implantation layer 709 in a region of the n-type semiconductor region 701 under and beside the peripheral transistor gate electrode 707 (in the direction from the inside of the peripheral transistor gate electrode 707 toward the outside thereof).

Then, as shown in FIG. 23B, after the first resist pattern 708 is removed, an HTO film 711 is grown to a thickness of 14 nm, for example, across the entire surface of the n-type semiconductor region 701 so as to cover the internal transistor gate electrode 706 and the peripheral transistor gate electrode 707. Then, in the internal transistor formation region CPMOS and in the peripheral transistor formation region IOPMOS, a fluorine ion implantation 710 is performed, through the HTO film 711, using the internal transistor gate electrode 706 and the peripheral transistor gate electrode 707 as a mask and under a condition with an acceleration energy of 10 KeV, a dose of $5.0\times10^{14}$ ions/cm$^2$ and a tilt angle of 0°, for example, to form a fluorine implantation layer 712 in a region of the n-type semiconductor region 701 under and beside the internal transistor gate electrode 706 (in the direction from the inside of the internal transistor gate electrode 706 toward the outside thereof) and in a region of the n-type semiconductor region 701 under and beside the peripheral transistor gate electrode 707 (in the direction from the inside of the peripheral transistor gate electrode 707 toward the outside thereof). While the fluorine ion implantation 710 is performed after the HTO film 711 is formed in the illustrated example, the ion implantation 710 may be performed before the HTO film 711 is formed for the purpose of more effectively diffusing the fluorine implantation layer 712.

Then, as shown in FIG. 24A, a 950° C., 0-second spike annealing process is performed using RTA to diffuse the fluorine implantation layer 712 into a region directly under the internal transistor gate electrode 706 in the internal circuit formation region CPMOS, and to diffuse the peripheral transistor p-type extension implantation layer 709 and the fluorine implantation layer 712 into a region directly under the peripheral transistor gate electrode 707 in the peripheral circuit formation region IOPMOS. In this step, the HTO film 711 functions as a diffusion-preventing film, preventing the outdiffusion of fluorine ions in the fluorine implantation layer 712. Thus, it is possible to effectively diffuse fluorine ions in the fluorine implantation layer 712 into a region directly under the internal transistor gate electrode 706 and a region directly under the peripheral transistor gate electrode 707. Therefore, through the heat treatment performed in the step shown in FIG. 26A to be described later, portions of the fluorine implantation layer 712 can easily be made to overlap together in a region directly under the internal transistor gate electrode 706 and in a region directly under the peripheral transistor gate electrode 707.

Then, as shown in FIG. 24B, the HTO film 711 is etched back to form a first sidewall 713 being a plate-shaped offset sidewall on the side surface of the internal transistor gate electrode 706 and the peripheral transistor gate electrode 707. Thus, the HTO film 711 can not only serve as an offset sidewall but also function as a cover film for effectively diffusing fluorine ions as described above. Therefore, it is not necessary to perform an additional step to form a cover film.

Figure 25A:
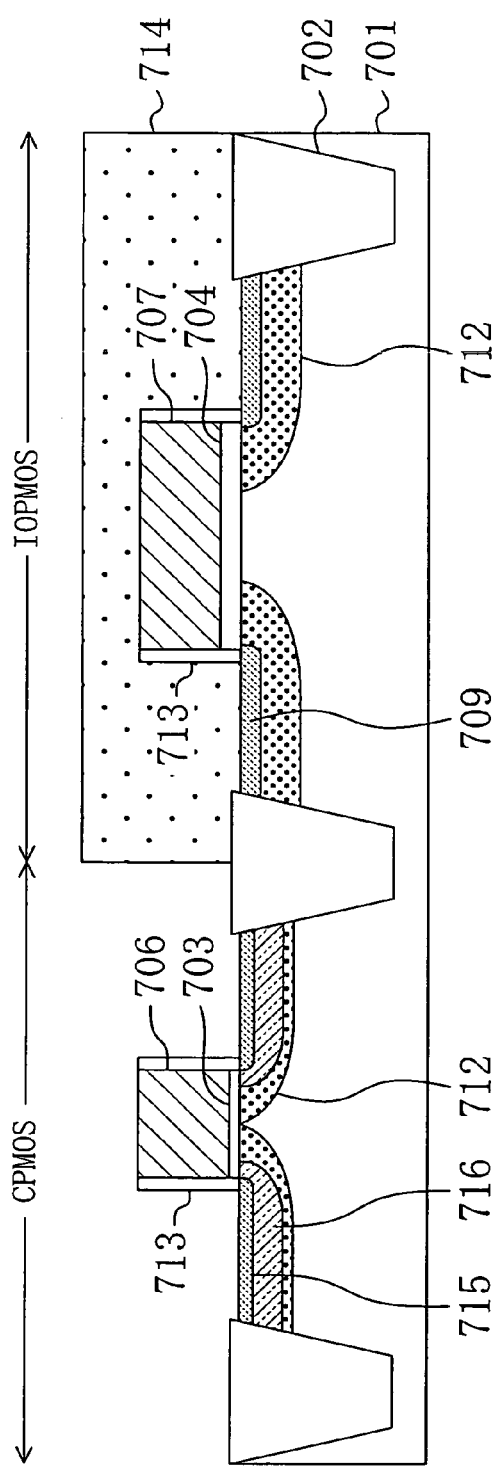
FIGS. 25A and 25B are cross-sectional views sequentially showing the steps of producing a semiconductor device according to the fifth embodiment of the present invention.

Then, as shown in FIG. 25A, a second resist pattern 714 is formed to cover the peripheral transistor formation region IOPMOS, and then boron ions are implanted into the internal transistor formation region CPMOS using the internal transistor gate electrode 706 and the first sidewall 713 as a mask and under a condition with an acceleration energy of 0.5 KeV, an implantation dose of $3.0\times10^{14}$ ions/cm$^2$ and a tilt angle of 0°, for example, to form an internal transistor p-type extension implantation layer 715 in a region of the n-type semiconductor region 701 under and beside the internal transistor gate electrode 706 (in the direction from the inside of the internal transistor gate electrode 706 toward the outside thereof). Then, phosphorus ions are implanted by four-step rotational implantation under a condition with an acceleration energy of 30 KeV, an implantation dose of $7.0\times10^{12}$ ions/cm$^2$ and a tilt angle of 25°, for example, to form an internal transistor n-type pocket implantation layer 716 at a lower position than the internal transistor p-type extension implantation layer 715.

Figure 25B:
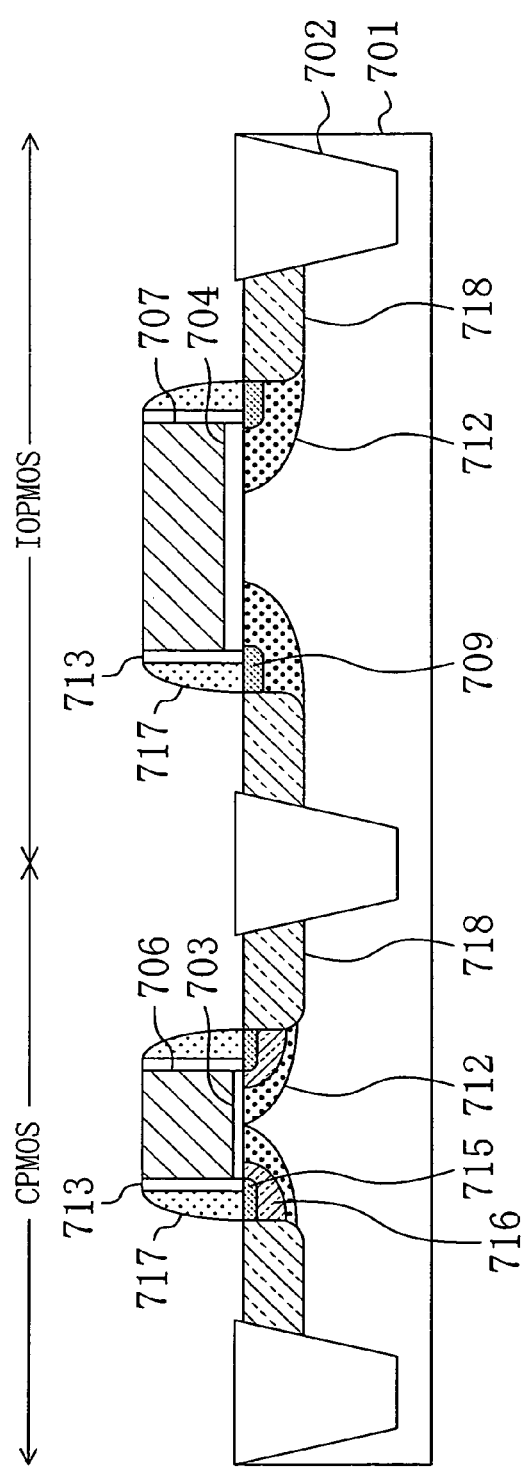

Then, as shown in FIG. 25B, after the second resist pattern 714 is removed, a silicon nitride film is grown across the entire surface of the n-type semiconductor region 701 and then etched back to form a second sidewall 717 being a silicon nitride film on the side surface of the first sidewall 713. Then, boron ions are implanted using the internal transistor gate electrode 706, the peripheral transistor gate electrode 707, the first sidewall 713 and the second sidewall 717 as a mask and under a condition with an acceleration energy of 2 KeV, an implantation dose of $4.0\times10^{15}$ ions/cm$^2$ and a tilt angle of 7°, for example. As a result, in the internal circuit formation region CPMOS, a p-type source-drain implantation layer 718 is formed in a region of the n-type semiconductor region 701 under and beside the second sidewall 717 (in the direction from the second sidewall 717 toward the device separation 702) so as to be adjacent to the internal transistor p-type extension implantation layer 715, the fluorine implantation layer 712 and the internal transistor n-type pocket implantation layer 716, whereas in the peripheral circuit formation region IOPMOS, the p-type source-drain implantation layer 718 is formed in a region of the n-type semiconductor region 701 under and beside the second sidewall 717 (in the direction from the second sidewall 717 toward the device separation 702) so as to be adjacent to the peripheral transistor p-type extension implantation layer 709 and the fluorine implantation layer 712. The p-type source-drain implantation layer 718 includes a p-type impurity with a higher concentration than that of the internal transistor p-type extension implantation layer 715, and includes a p-type impurity with a higher concentration than that of the peripheral transistor p-type extension implantation layer 709.

Figures 26A, 26B:
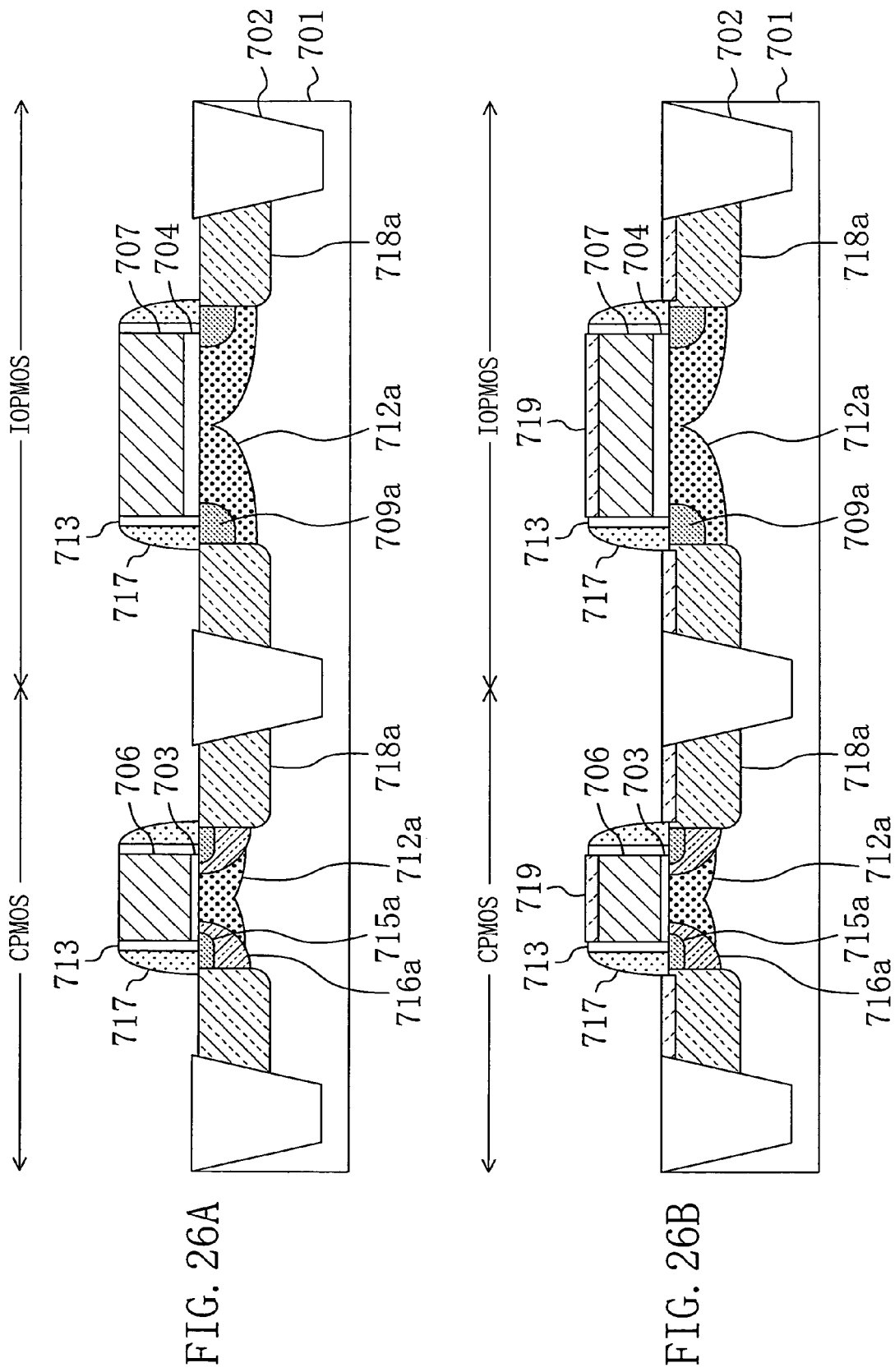
FIGS. 26A and 26B are cross-sectional views sequentially showing the steps of producing a semiconductor device according to the fifth embodiment of the present invention.

Then, as shown in FIG. 26A, a 1,050° C., 0-second spike annealing process is performed using RTA to form a fluorine diffusion layer 712a having a profile obtained by portions of the fluorine implantation layer 712 being diffused into, and overlapping together in, a region directly under the internal transistor gate electrode 706, in the internal circuit formation region CPMOS. At the same time, this step forms a peripheral transistor fluorine diffusion layer 712a having a profile obtained by portions of the fluorine implantation layer 712 being diffused into, and overlapping together in, a region directly under the peripheral transistor gate electrode 707, in the peripheral circuit formation region IOPMOS. At the same time, this step activates the internal transistor p-type extension implantation layer 715, the internal transistor n-type pocket implantation layer 716, the peripheral transistor p-type extension implantation layer 709 and the p-type source-drain implantation layer 718 to form an internal transistor p-type extension diffusion layer 715a, an internal transistor n-type pocket diffusion layer 716a, a peripheral transistor p-type extension diffusion layer 709a and a p-type source-drain diffusion layer 718a.

With this step, since the gate length of the internal transistor gate electrode 706 has been sufficiently shortened by the miniaturization of semiconductor devices, it is possible to realize an internal transistor fluorine diffusion layer 712a having a profile obtained by portions thereof sufficiently overlapping together in a region directly under the internal transistor gate electrode 706. Although the gate length of the peripheral transistor gate electrode 707 is longer than that of the internal transistor gate electrode 706, the HTO film 711 is present in the low-temperature heat treatment shown in FIG. 24A, whereby fluorine ions are previously diffused into a region directly under the peripheral transistor gate electrode 707 without outdiffusion. Thus, in this step, it is possible to realize the fluorine diffusion layer 712a having a profile obtained by portions thereof being diffused into, and sufficiently overlapping together in, a region directly under the peripheral transistor gate electrode 707. Thus, it is possible to suppress the NBTI degradation in internal transistors and peripheral transistors. In the step shown in FIG. 24A, since the HTO film 711 serves as a cover film for preventing the outdiffusion of fluorine ions, the concentration of the fluorine implantation layer 712 formed in the step shown in FIG. 23B may be lower than those of the internal transistor fluorine implantation layer and the peripheral transistor fluorine implantation layer in the second embodiment.

Then, as shown in FIG. 26B, a silicide layer 721 is formed on the internal transistor gate electrode 706, the peripheral transistor gate electrode 707 and the p-type source-drain diffusion layer 718a.

Sixth Embodiment

A method for producing a semiconductor device according to a sixth embodiment of the present invention will now be described.

FIGS. 27A to 31B are cross-sectional views sequentially showing the steps of producing the semiconductor device of the sixth embodiment. FIGS. 27A to 31B show a structure where a p-channel MIS transistor is provided on the substrate in the internal circuit formation region CPMOS (e.g., a region for forming an internal transistor, which receives a relatively low power supply voltage at the gate thereof to perform arithmetic operations), and a p-channel MIS transistor is provided on the substrate in the peripheral circuit formation region IOPMOS (e.g., a region for forming a peripheral transistor, which receives a relatively high power supply voltage at the gate thereof to exchange data with other chips or to handle analog data), which is different from the internal circuit formation region CPMOS.

First, as shown in FIG. 27A, an internal transistor gate insulating film 803 being an oxide film, for example, is formed in the internal circuit formation region CPMOS, which is a region of an n-type semiconductor region 801 surrounded by a device separation 802 being STI (shallow trench isolation), and a peripheral transistor gate insulating film 804 thicker than the internal transistor gate insulating film 803 is formed in the peripheral circuit formation region IOPMOS, which is another such region. Then, a gate electrode formation film 805 being a polysilicon film is formed on the device separation 802, the internal transistor gate insulating film 803 and the peripheral transistor gate insulating film 804.

Then, as shown in FIG. 27B, the internal transistor gate insulating film 803, the peripheral transistor gate insulating film 804 and the gate electrode formation film 805 are patterned by using an etching method. Thus, an internal transistor gate electrode 806 and a peripheral transistor gate electrode 807 are obtained from the gate electrode formation film 805.

Then, as shown in FIG. 28A, a first resist pattern 808 is formed to cover the internal transistor formation region CPMOS, and then $BF_2$ ions are implanted by four-step rotational implantation into the peripheral transistor formation region IOPMOS using the peripheral transistor gate electrode 807 as a mask and under a condition with an acceleration energy of 45 KeV, an implantation dose of $1.2 \times 10^{13}$ ions/cm$^2$ and a tilt angle of 7°, for example, to form a peripheral transistor p-type extension implantation layer 809 in a region of the n-type semiconductor region 801 under and beside the peripheral transistor gate electrode 807 (in the direction from the inside of the peripheral transistor gate electrode 807 toward the outside thereof). Then, a fluorine ion implantation 810 is performed under a condition with an acceleration energy of 10 KeV, a dose of $5.0 \times 10^{14}$ ions/cm$^2$ and a tilt angle of 7°, for example, to form a peripheral transistor fluorine implantation layer 811 in a region of the n-type semiconductor region 801 under and beside the peripheral transistor gate electrode 807. It is preferred that the ion implantation 810 is performed at an inclined angle with respect to an axis perpendicular to the surface of the n-type semiconductor region 801, whereby the peripheral transistor fluorine implantation layer 811 can be formed deep into a region directly under the peripheral transistor gate electrode 807. However, the ion implantation 810 may be performed in a direction perpendicular to the surface of the n-type semiconductor region 801.

Then, as shown in FIG. 28B, after the first resist pattern 808 is removed, an HTO film 812 is grown to a thickness of 14 nm across the entire surface of the n-type semiconductor region 801 so as to cover the internal transistor gate electrode 806 and the peripheral transistor gate electrode 807. Then, in the internal transistor formation region CPMOS and in the peripheral transistor formation region IOPMOS, a fluorine ion implantation 813 is performed, through the HTO film 812, using the internal transistor gate electrode 806 and the peripheral transistor gate electrode 807 as a mask and under a condition with an acceleration energy of 10 KeV, a dose of $5.0\times10^{14}$ ions/cm$^2$ and a tilt angle of 0°, for example, to form a fluorine implantation layer 814 in a region of the n-type semiconductor region 801 under and beside the internal transistor gate electrode 806 (in the direction from the inside of the internal transistor gate electrode 806 toward the outside thereof) and in a region of the n-type semiconductor region 801 under and beside the peripheral transistor gate electrode 807 (in the direction from the inside of the peripheral transistor gate electrode 807 toward the outside thereof). While the fluorine ion implantation 813 is performed after the HTO film 812 is formed in the illustrated example, the ion implantation 813 may be performed before the HTO film 812 is formed for the purpose of more effectively diffusing the fluorine implantation layer 814.

Figures 29A, 29B:
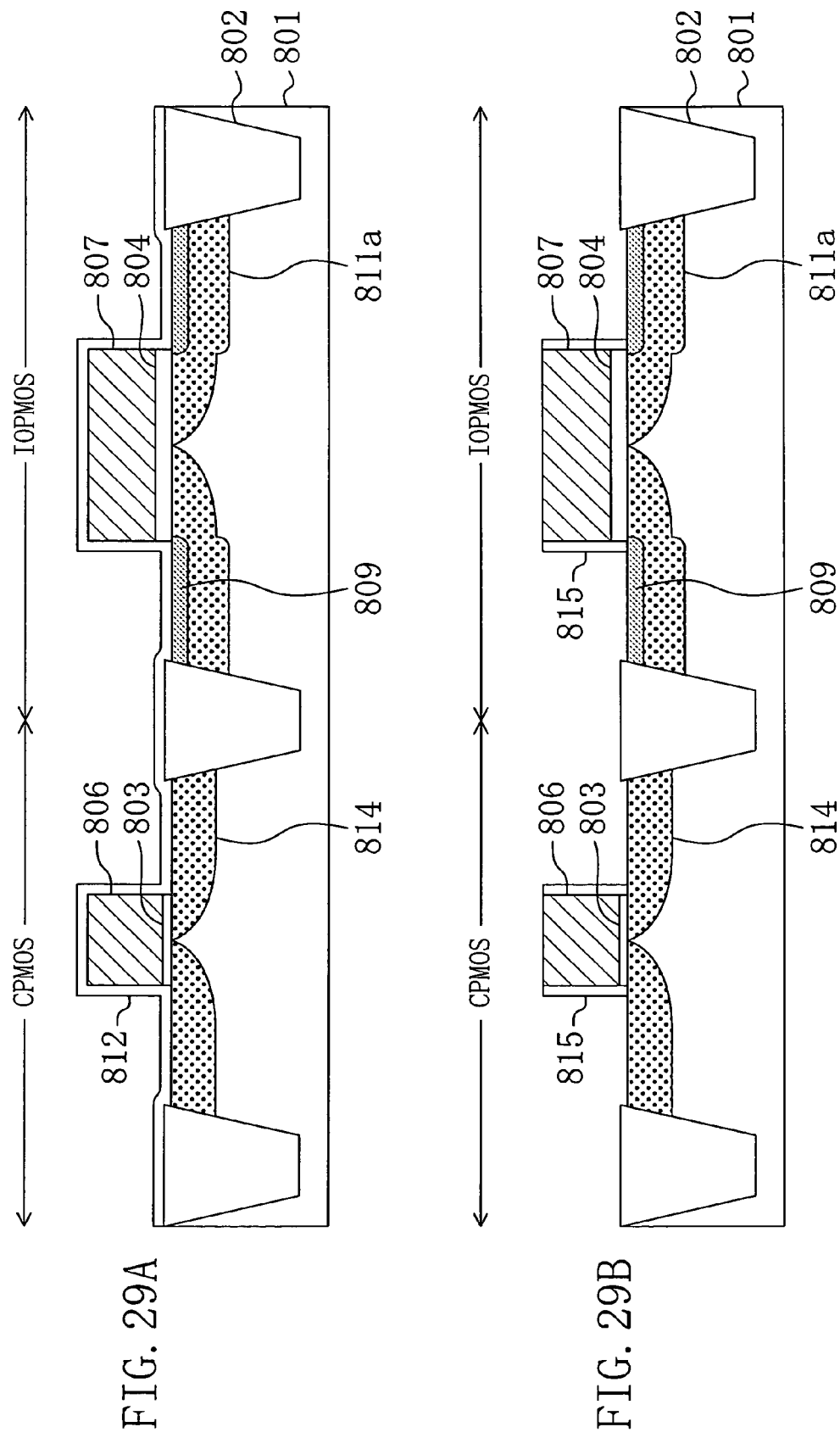
FIGS. 29A and 29B are cross-sectional views sequentially showing the steps of producing a semiconductor device according to the sixth embodiment of the present invention.
Figure 32A:
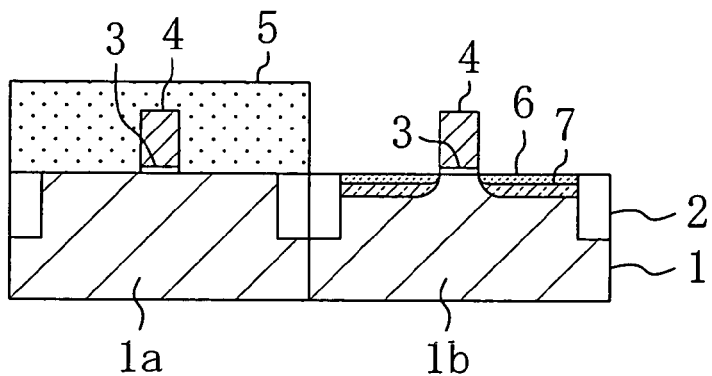
FIGS. 32A to 32D are cross-sectional views sequentially showing the steps of a conventional method for producing a semiconductor device according to the sixth embodiment of the present invention.
Figure 32B:
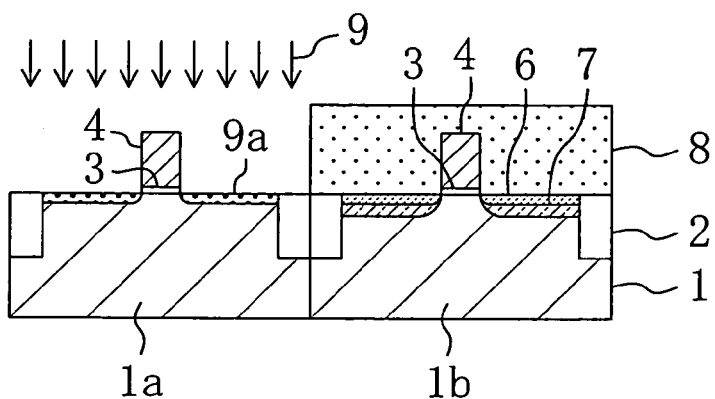
Figure 32C:
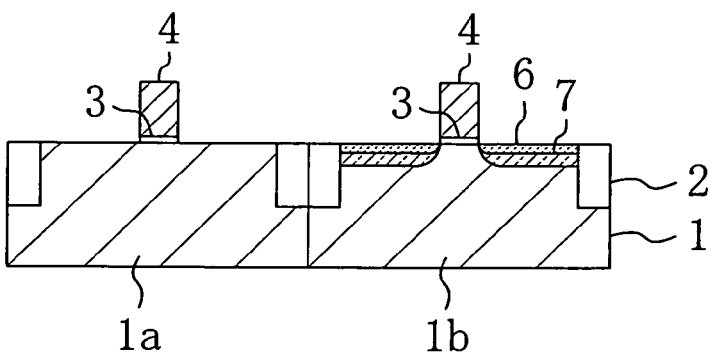
Figure 32D:
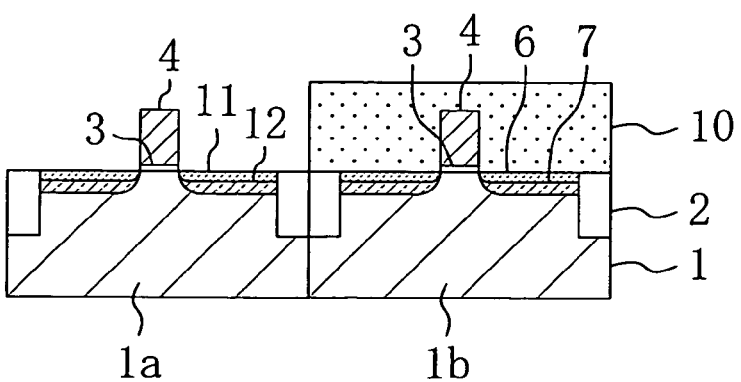

Then, as shown in FIG. 29A, a 950° C., 0-second spike annealing process is performed using RTA to diffuse the fluorine implantation layer 814 into a region directly under the internal transistor gate electrode 806 in the internal circuit formation region CPMOS, and to diffuse the peripheral transistor p-type extension implantation layer 809 while diffusing the peripheral transistor fluorine implantation layer 811 and the fluorine implantation layer 814 into a region directly under the peripheral transistor gate electrode 807, to form a fluorine diffusion layer 811a in the peripheral circuit formation region IOPMOS. In this step, the HTO film 812 functions as a diffusion-preventing film, preventing the outdiffusion of fluorine ions in the peripheral transistor fluorine implantation layer 811 and the fluorine implantation layer 814. Thus, in the internal circuit formation region CPMOS, it is possible to effectively diffuse the fluorine implantation layer 814 into a region directly under the internal transistor gate electrode 806, whereas in the peripheral circuit formation region IOPMOS, it is possible to effectively diffuse fluorine ions in the peripheral transistor fluorine implantation layer 811 and the fluorine implantation layer 814 into a region directly under the peripheral transistor gate electrode 807. Therefore, through the heat treatment performed in the step shown in FIG. 31A to be described later, portions of an internal transistor fluorine diffusion layer 814a and a peripheral transistor fluorine diffusion layer 811b can easily be made to overlap together in a region directly under the internal transistor gate electrode 806 and in a region directly under the peripheral transistor gate electrode 807, respectively.

Then, as shown in FIG. 29B, the HTO film 812 is etched back to form a first sidewall 815 being a plate-shaped offset sidewall on the side surface of the internal transistor gate electrode 806 and the peripheral transistor gate electrode 807. Thus, the HTO film 812 can not only serve as an offset sidewall but also function as a cover film for effectively diffusing fluorine ions as described above. Therefore, it is not necessary to perform an additional step to form a cover film.

Then, as shown in FIG. 30A, a second resist pattern 816 is formed to cover the peripheral transistor formation region IOPMOS, and then boron ions are implanted into the internal transistor formation region CPMOS using the internal transistor gate electrode 806 and the first sidewall 815 as a mask and under a condition with an acceleration energy of 0.5 KeV, an implantation dose of $3.0\times10^{14}$ ions/cm$^2$ and a tilt angle of 0°, for example, to form an internal transistor p-type extension implantation layer 817 in a region of the n-type semiconductor region 801 under and beside the internal transistor gate electrode 806 (in the direction from the inside of the internal transistor gate electrode 806 toward the outside thereof). Then, phosphorus ions are implanted by four-step rotational implantation under a condition with an acceleration energy of 30 KeV, an implantation dose of $7.0\times10^{12}$ ions/cm$^2$ and a tilt angle of 25°, for example, to form an internal transistor n-type pocket implantation layer 818 at a lower position than the internal transistor p-type extension implantation layer 817.

Then, as shown in FIG. 30B, after the second resist pattern 816 is removed, a silicon nitride film is grown across the entire surface of the n-type semiconductor region 801 and then etched back to form a second sidewall 819 being a silicon nitride film on the side surface of the first sidewall 815. Then, boron ions are implanted using the internal transistor gate electrode 806, the peripheral transistor gate electrode 807, the first sidewall 815 and the second sidewall 819 as a mask and under a condition with an acceleration energy of 2 KeV, an implantation dose of $4.0\times10^{15}$ ions/cm$^2$ and a tilt angle of 7°, for example. As a result, in the internal circuit formation region CPMOS, a p-type source-drain implantation layer 820 is formed in a region of the n-type semiconductor region 801 under and beside the second sidewall 819 (in the direction from the second sidewall 819 toward the device separation 802) so as to be adjacent to the internal transistor p-type extension implantation layer 817, the fluorine implantation layer 814 and the internal transistor n-type pocket implantation layer 818, whereas in the peripheral circuit formation region IOPMOS, the p-type source-drain implantation layer 820 is formed in a region of the n-type semiconductor region 801 under and beside the second sidewall 819 (in the direction from the second sidewall 819 toward the device separation 802) so as to be adjacent to the peripheral transistor p-type extension implantation layer 809 and the fluorine diffusion layer 811a. The p-type source-drain implantation layer 820 includes a p-type impurity with a higher concentration than that of the internal transistor p-type extension implantation layer 817, and includes a p-type impurity with a higher concentration than that of the peripheral transistor p-type extension implantation layer 809.

Then, as shown in FIG. 31A, a 1,050° C., 0-second spike annealing process is performed using RTA to form the internal transistor fluorine diffusion layer 814a having a profile obtained by portions of the fluorine implantation layer 814 being diffused into, and overlapping together in, a region directly under the internal transistor gate electrode 806, in the internal circuit formation region CPMOS. At the same time, this step forms the peripheral transistor fluorine diffusion layer 811b having a profile obtained by portions of the fluorine diffusion layer 811a being diffused into, and overlapping together in, a region directly under the peripheral transistor gate electrode 807, in the peripheral circuit formation region IOPMOS. At the same time, this step activates the internal transistor p-type extension implantation layer 817, the internal transistor n-type pocket implantation layer 818, a peripheral transistor p-type extension implantation layer 809a and the p-type source-drain implantation layer 820 to form an internal transistor p-type extension diffusion layer 817a, an internal transistor n-type pocket diffusion layer 818a, a peripheral transistor p-type extension diffusion layer 809b and a p-type source-drain diffusion layer 820a.

With this step, since the gate length of the internal transistor gate electrode 806 has been sufficiently shortened by the miniaturization of semiconductor devices, it is possible to realize the internal transistor fluorine diffusion layer 814a having a profile obtained by portions thereof sufficiently overlapping together in a region directly under the internal transistor gate electrode 806. Although the gate length of the peripheral transistor gate electrode 807 is longer than that of the internal transistor gate electrode 806, the HTO film 812 is present in the low-temperature heat treatment shown in FIG. 29A, whereby fluorine ions are previously diffused into the peripheral transistor gate electrode 807 without outdiffusion. Moreover, more fluorine ions are implanted than in the fifth embodiment because the peripheral transistor fluorine implantation layer 811 is formed in FIG. 28A. Thus, in this step, it is possible to realize the fluorine diffusion layer 811b having a profile obtained by portions thereof being diffused into, and sufficiently overlapping together in, a region directly under the peripheral transistor gate electrode 807. Thus, it is possible to suppress the NBTI degradation in internal transistors and peripheral transistors. In the step shown in FIG. 29A, since the HTO film 812 serves as a cover film for preventing the outdiffusion of fluorine ions, the concentration of the fluorine implantation layer 814 formed in the step shown in FIG. 28B may be lower than those of the internal transistor fluorine implantation layer and the peripheral transistor fluorine implantation layer in the second embodiment.

Then, as shown in FIG. 31B, a silicide layer 821 is formed on the internal transistor gate electrode 806, the peripheral transistor gate electrode 807 and the p-type source-drain diffusion layer 820a.

While the first to sixth embodiments are directed to cases where p-channel MIS transistors are provided, the present invention is also applicable to cases where n-channel MIS transistors are provided. While a silicon nitride film is used as the second sidewall, the second sidewall may be a silicon oxide film or a layered film of a silicon oxide film and a silicon nitride film.

The semiconductor device and the method for producing the same of the present invention are useful in suppressing the NBTI degradation in transistors.

What is claimed is:

1. A semiconductor device, comprising a first MIS-type transistor formed in a first region of a semiconductor region, the first region being of a first conductivity type, the first MIS-type transistor including:
    a first gate insulating film formed on the first region;
    a first gate electrode formed on the first gate insulating film;
    a first extension diffusion layer of a second conductivity type formed in a region of the first region under both sides the first gate electrode;
    a pocket diffusion layer of a first conductivity type formed in a region of the first region under both sides of the first gate electrode so as to cover a lower side of the first extension diffusion; and
    a first fluorine diffusion layer formed in a first channel region of the first conductivity type sandwiched between portions of the pocket diffusion layer, wherein portions of the first fluorine diffusion layer extend from each side of the portions of the pocket diffusion layer and overlap together in a region directly under the first gate electrode.

2. The semiconductor device of claim 1, further comprising:
    a first MIS-type transistor sidewall formed on a side surface of the first gate electrode; and
    a first source-drain diffusion layer of the second conductivity type formed in a region of the first region under and beside the first MIS-type transistor sidewall so as to be adjacent to the first extension diffusion layer.

3. The semiconductor device of claim 2, wherein the first MIS-type transistor sidewall includes:
    a plate-shaped first sidewall formed on a side surface of the first gate electrode; and
    a second sidewall formed on a side surface of the first sidewall.

4. The semiconductor device of claim 2, further comprising a silicide layer formed on the first gate electrode and the first source-drain diffusion layer.

5. The semiconductor device of claim 1, wherein the first conductivity type is n type and the second conductivity type is p type.

6. A semiconductor device, comprising a first MIS-type transistor formed in a first region of a semiconductor region and a second MIS-type transistor formed in a second region of the semiconductor region, different from the first region, the first region being of a first conductivity type and the second region being of the first conductivity type,
    the first MIS-type transistor including:
    a first gate insulating film formed on the first region;
    a first gate electrode formed on the first gate insulating film;
    a first extension diffusion layer of a second conductivity type formed in a region of the first region under and beside the first gate electrode; and
    a first fluorine diffusion layer formed in a first channel region of the first conductivity type sandwiched between portions of the first extension diffusion layer, wherein portions of the first fluorine diffusion layer extend from the first extension diffusion layer and overlap together in a region directly under the first gate electrode,
    the second MIS-type transistor including:
    a second gate insulating film formed on the second region;
    a second gate electrode formed on the second gate insulating film and having a gate length longer than that of the first gate electrode;
    a second extension diffusion layer of a second conductivity type formed in a region of the second region under and beside the second gate electrode; and
    a second fluorine diffusion layer formed in a second channel region of the first conductivity type sandwiched between portions of the second extension diffusion layer, wherein portions of the second fluorine diffusion layer extend from the second extension diffusion layer and overlap together in a region directly under the second gate electrode.

7. The semiconductor device of claim 6, further comprising:
    a second MIS-type transistor sidewall formed on a side surface of the second gate electrode; and
    a second source-drain diffusion layer of the second conductivity type formed in a region of the second region under and beside the second MIS-type transistor sidewall so as to be adjacent to the second extension diffusion layer.

8. The semiconductor device of claim 7, wherein the second MIS-type transistor sidewall includes:
- a plate-shaped third sidewall formed on a side surface of the first gate electrode; and
- a fourth sidewall formed on a side surface of the first sidewall.

9. The semiconductor device of claim 6, wherein a pocket layer of the first conductivity type covering a lower side of the first extension diffusion layer is formed in the region of the first region under and beside the first gate electrode, whereas a pocket layer of the first conductivity type covering a lower side of the second extension diffusion layer is not formed in a region of the second region under and beside the second gate electrode.

10. The semiconductor device of claim 6, wherein a thickness of the second gate insulating film is greater than that of the first gate insulating film.

11. The semiconductor device of claim 6, wherein a voltage applied to the first gate electrode is lower than that applied to the second gate electrode.

* * * * *